United States Patent
Ching et al.

(10) Patent No.: US 10,700,183 B2
(45) Date of Patent: Jun. 30, 2020

(54) FIN FIELD EFFECT TRANSISTOR (FINFET) DEVICE STRUCTURE AND METHOD FOR FORMING THE SAME

(71) Applicant: TAIWAN SEMICONDUCTOR MANUFACTURING CO., LTD., Hsinchu (TW)

(72) Inventors: Kuo-Cheng Ching, Zhubei (TW); Kuan-Ting Pan, Taipei (TW); Shi-Ning Ju, Hsinchu (TW); Chih-Hao Wang, Baoshan Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/226,827

(22) Filed: Dec. 20, 2018

(65) Prior Publication Data

US 2020/0127124 A1    Apr. 23, 2020

Related U.S. Application Data

(60) Provisional application No. 62/747,720, filed on Oct. 19, 2018.

(51) Int. Cl.
| | |
|---|---|
| *H01L 27/088* | (2006.01) |
| *H01L 29/66* | (2006.01) |
| *H01L 29/78* | (2006.01) |
| *H01L 29/06* | (2006.01) |
| *H01L 29/08* | (2006.01) |
| *H01L 21/762* | (2006.01) |

(52) U.S. Cl.
CPC .. *H01L 29/66818* (2013.01); *H01L 21/76224* (2013.01); *H01L 29/0653* (2013.01); *H01L 29/0847* (2013.01); *H01L 29/66545* (2013.01); *H01L 29/7851* (2013.01)

(58) Field of Classification Search
CPC ................................. H01L 29/66818
USPC ........................................... 257/401
See application file for complete search history.

(56) References Cited

U.S. PATENT DOCUMENTS

| | | | | |
|---|---|---|---|---|
| 2013/0200470 A1* | 8/2013 | Liu | ................... | H01L 29/66795 257/408 |
| 2014/0227850 A1* | 8/2014 | Zhang | ................. | H01L 27/1211 438/289 |
| 2016/0343856 A1* | 11/2016 | Leobandung | ......... | H01L 23/535 |

\* cited by examiner

*Primary Examiner* — Ajay Arora
(74) *Attorney, Agent, or Firm* — Birch, Stewart, Kolasch & Birch, LLP

(57) ABSTRACT

A method for forming a FinFET device structure includes forming a first fin structure in a core region of a substrate and a second fin structure in an input/output region of the substrate with a fin top layer and a hard mask layer over the fin structures. The method also includes forming a dummy oxide layer across the fin structures. The method also includes forming a dummy gate structure over the dummy oxide layer. The method also includes removing the dummy gate structure over fin structures. The method also includes removing the dummy oxide layer and trimming the fin structures. The method also includes forming first and second oxide layers across the first and second fin structures. The method also includes forming first and second gate structures over the first and second oxide layers across the first and second fin structures.

20 Claims, 41 Drawing Sheets

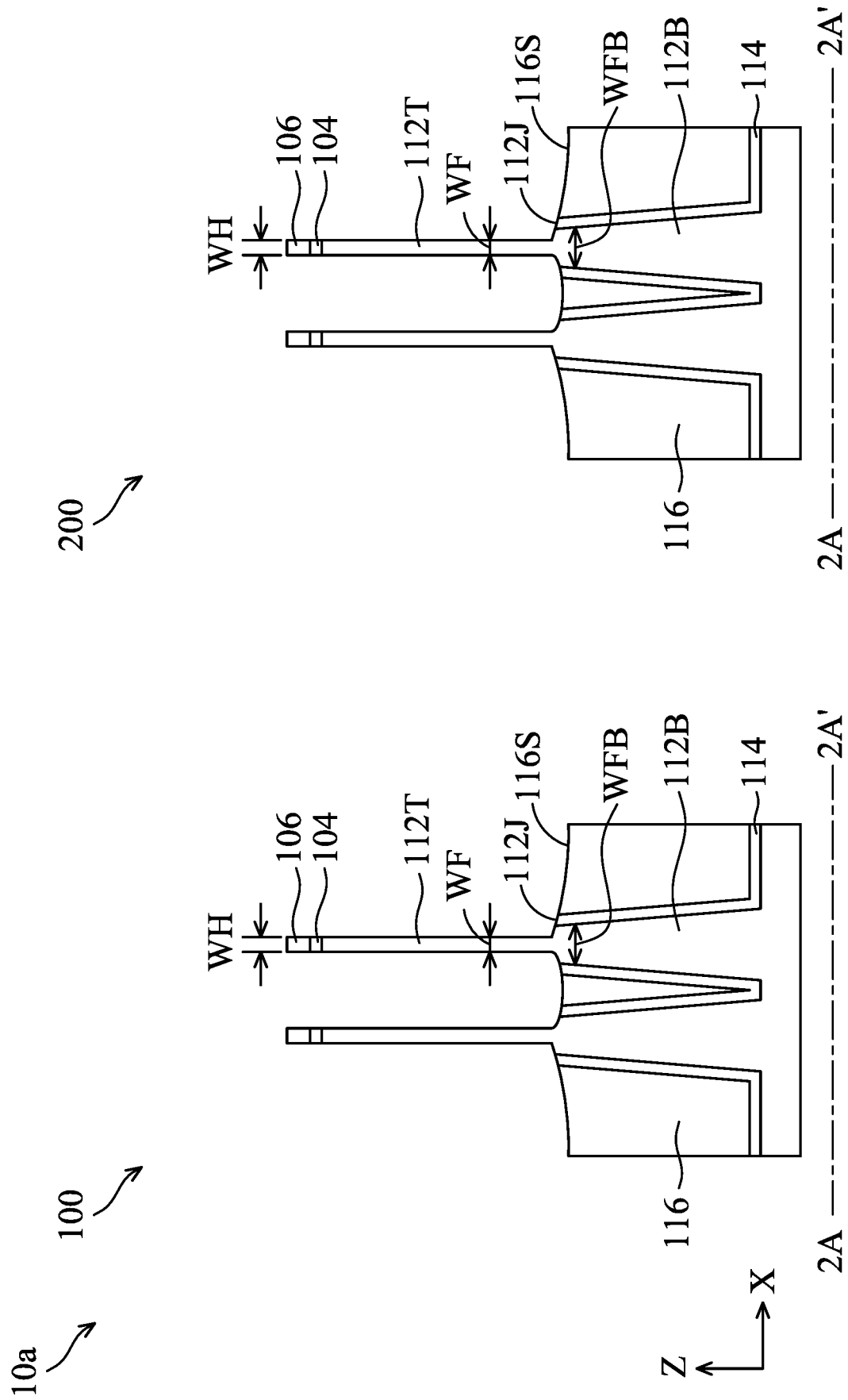

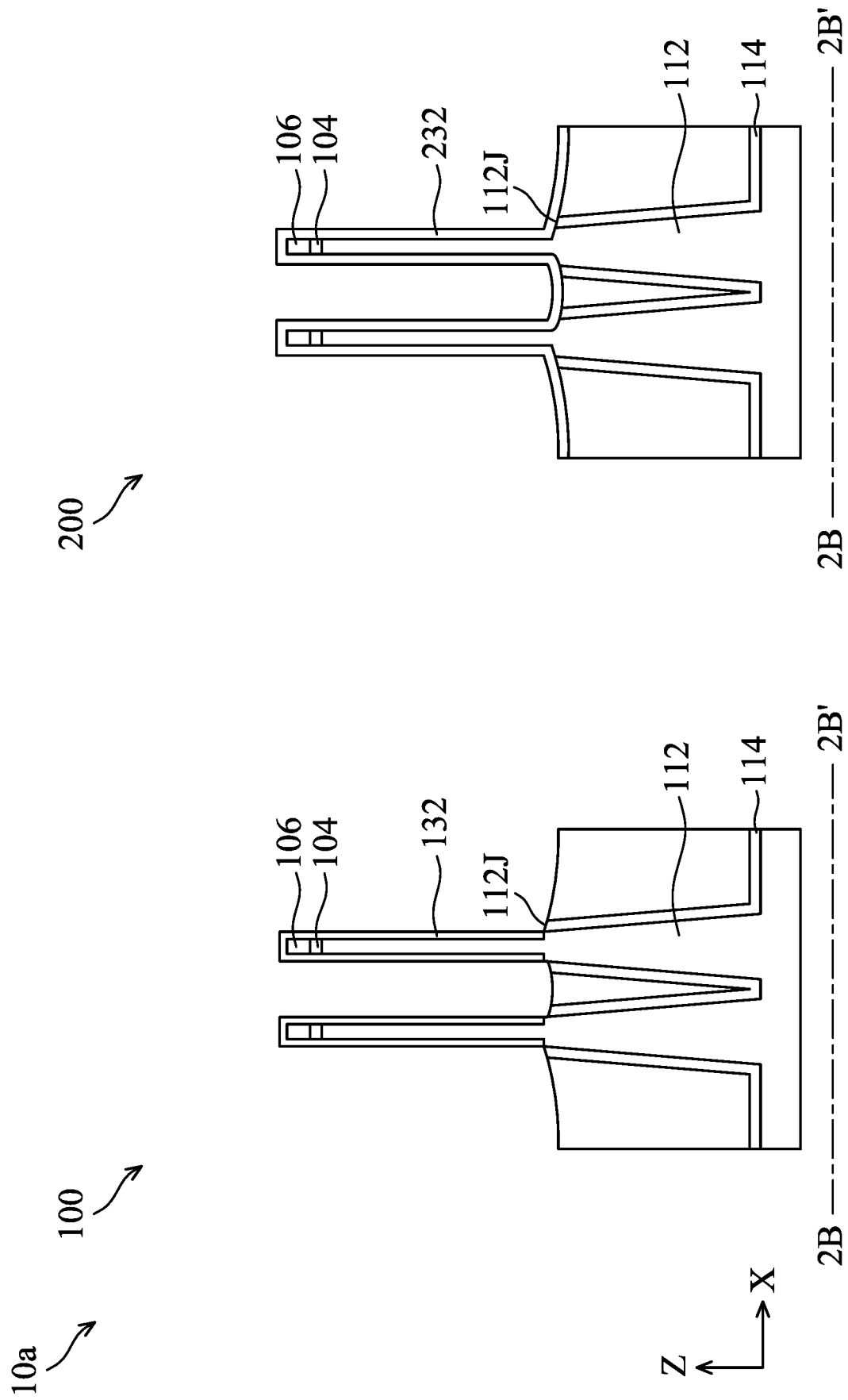

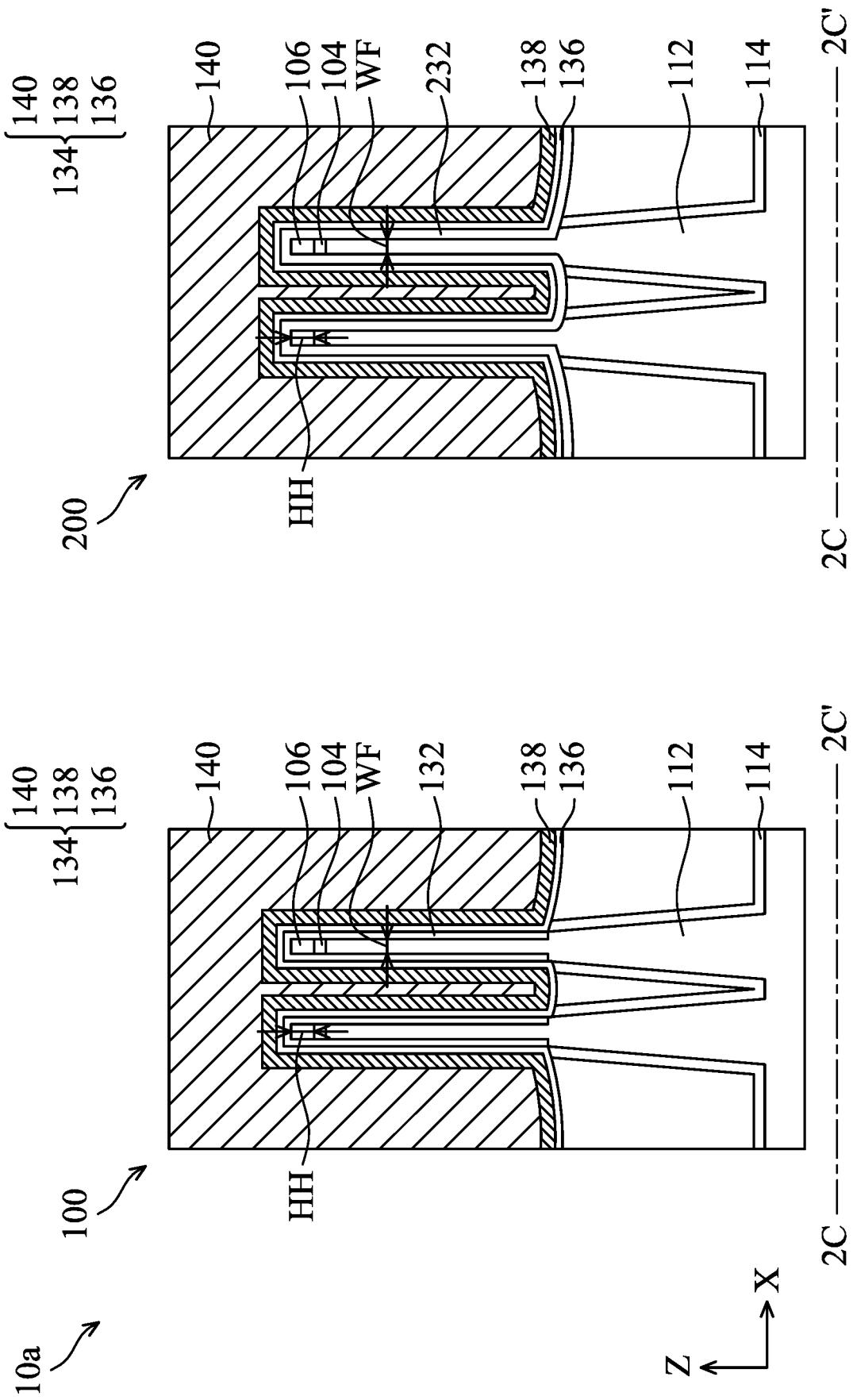

FIN FIELD EFFECT TRANSISTOR (FINFET) DEVICE STRUCTURE AND METHOD FOR FORMING THE SAME

CROSS REFERENCE TO RELATED APPLICATIONS

This application claims the benefit of U.S. Provisional Application No. 62/747,720, filed on Oct. 19, 2018, the entirety of which is/are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 2B-1, 2B-2, 2C-1, 2C-2, 2D-1, 2D-2 are cross-sectional representations of various stages of forming a FinFET device structure shown in FIGS. 1J-1, 1J-2, 1K-1, 1K-2, 1L-1, 1L-2, in accordance with some embodiments of the disclosure.

FIGS. 3A-1, 3A-2, 3B-1, 3B-2, 3C-1, 3C-2 are perspective representations of various stages of forming a modified FinFET device structure, in accordance with some other embodiments of the disclosure.

FIGS. 4A-1, 4A-2, 4B-1, 4B-2, 4C-1, 4C-2 are perspective representations of various stages of forming a modified FinFET device structure, in accordance with some other embodiments of the disclosure.

FIGS. 5A-1, 5A-2 are cross-sectional representations of various stages of forming a FinFET device structure shown in FIGS. 4C-1, 4C-2, in accordance with some embodiments of the disclosure.

DETAILED DESCRIPTION

Figures 1, 1A:
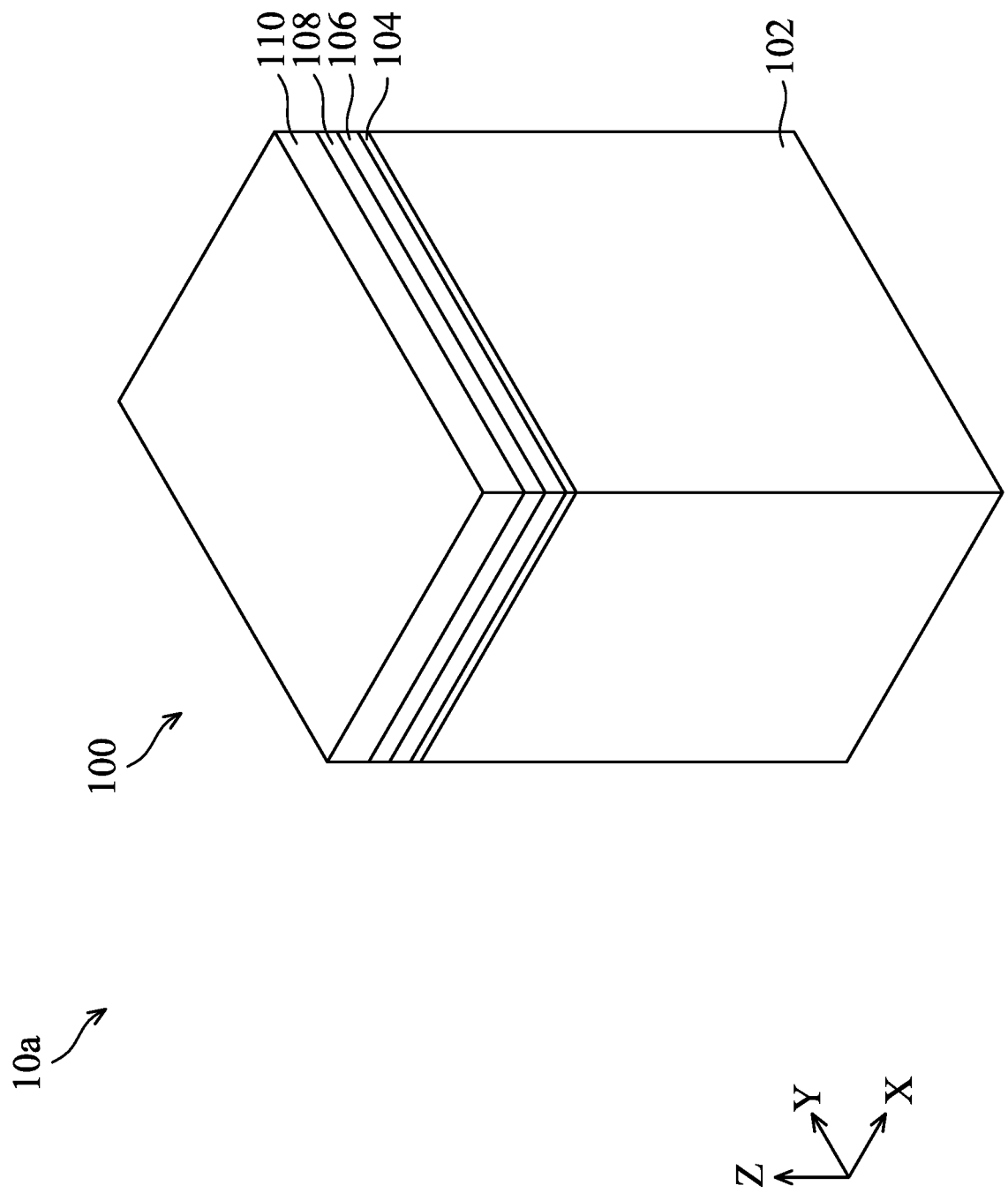
FIGS. 1A-1, 1A-2, 1B-1, 1B-2, 1C-1, 1C-2, 1D-1, 1D-2, 1E-1, 1E-2, 1F-1, 1F-2, 1G-1, 1G-2, 1H-1, 1H-2, 1I-1, 1I-2, 1J-1, 1J-2, 1K-1, 1K-2, 1L-1, 1L-2 are perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a fin field effect transistor (FinFET) device structure are provided. The method for forming the FinFET device structure may include forming fin structures in a core region and an input/output (I/O) region respectively. In the gate-last process, by forming a fin top layer over the fin structure before forming the dummy gate structure, the fin top layer may protect the top of the fin structure from damage while removing the dummy gate structure. Moreover, by trimming the fin structures in both core region and the I/O region after the dummy gate structure is removed, the space between adjacent fin structures may be enlarged, and the process window of forming the gate structures over the fin structures in both core region and the I/O region may be improved.

Figures 1, 1A, 2:
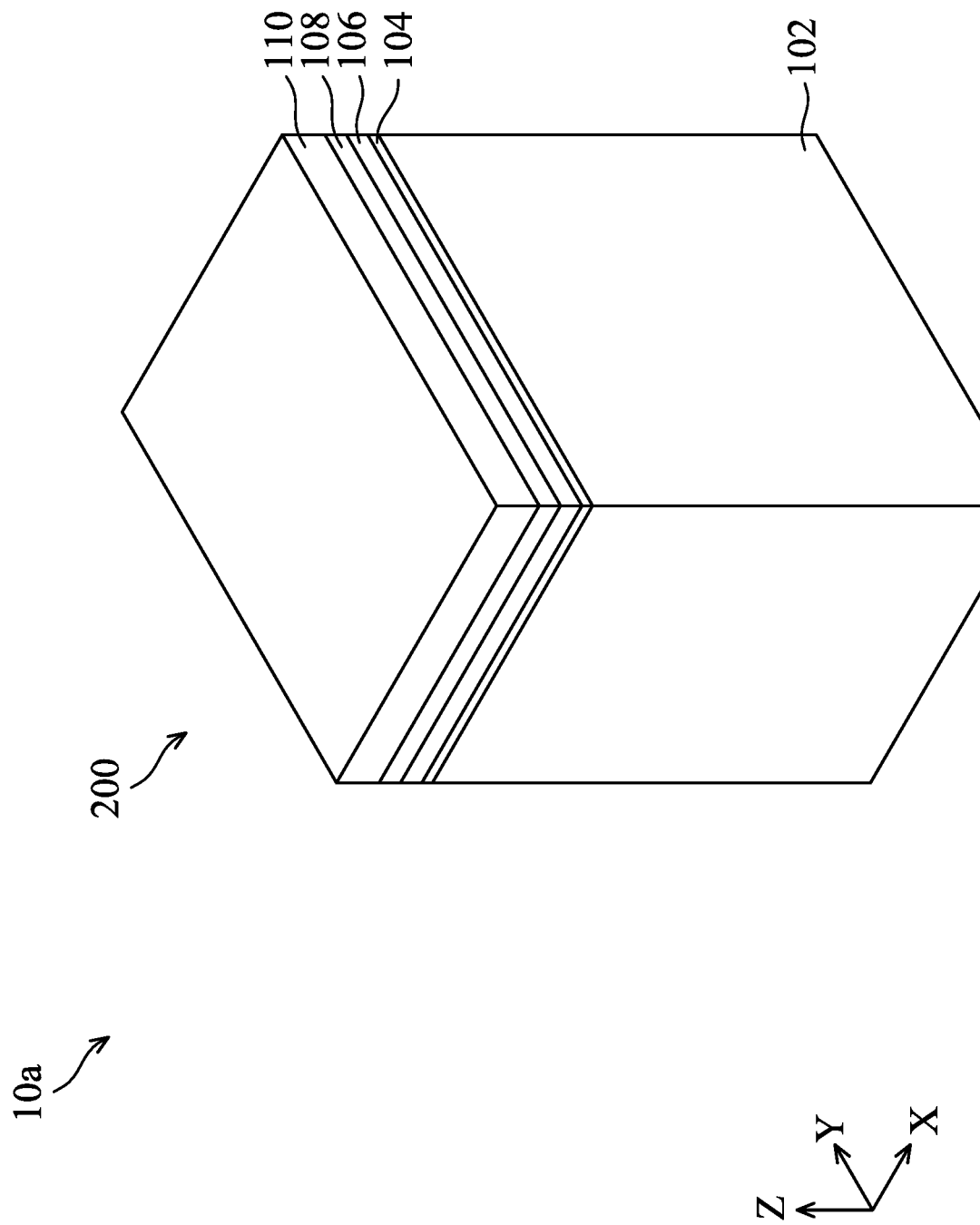

FIGS. 1A-1, 1A-2, 1B-1, 1B-2, 1C-1, 1C-2, 1D-1, 1D-2, 1E-1, 1E-2, 1F-1, 1F-2, 1G-1, 1G-2, 1H-1, 1H-2, 1I-1, 1I-2, 1J-1, 1J-2, 1K-1, 1K-2, 1L-1, 1L-2 are perspective representations of various stages of forming a FinFET device structure 10a, in accordance with some embodiments of the disclosure. FIGS. 2A-1, 2A-2, 2B-1, 2B-2, 2C-1, 2C-2, 2D-1, 2D-2 are cross-sectional representations of various stages of forming a FinFET device structure shown in FIGS. 1J-1, 1J-2, 1K-1, 1K-2, 1L-1, 1L-2, in accordance with some embodiments of the disclosure. FIGS. 2A-1 and 2A-2 show cross-sectional representations taken along line 2A-2A' in FIGS. 1J-1 and 1J-2. FIGS. 2B-1 and 2B-2 show cross-sectional representations taken along line 2B-2B' in FIGS. 1K-1 and 1K-2. FIGS. 2C-1, 2C-2 and 2D-1, 2D-2 show cross-sectional representations taken along line 2C-2C' and 2D-2D' in FIGS. 1L-1 and 1L-2 respectively.

A substrate 102 is provided as shown in FIGS. 1A-1 and 1A-2 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof.

In some embodiments, the substrate 102 may be an N-type substrate. In some embodiments, the substrate 102 may be a P-type substrate. In some embodiments, as shown in FIG. 1A-1, the substrate 102 includes a core region 100 with core devices formed thereon. In some embodiments, as shown in FIG. 1A-2, the substrate 102 includes an I/O region 200 with I/O devices formed thereon. In the following, figures having the suffix "-1" (e.g., FIG. 1B-1) are perspective representations or cross-sectional representations of some embodiments of the FinFET device structure formed in the core region 100. In addition, figures having the suffix "-2" (e.g., FIG. 1B-2) are perspective representations or cross-sectional representations of some embodiments of the FinFET device structure formed in the I/O region 200.

Next, a pad layer 104 is blanketly formed over the substrate 102 in the core region 100 and the I/O region 200, and a fin top layer 106 is blanketly formed over the pad layer 104 as shown in FIGS. 1A-1 and 1A-2 in accordance with some embodiments. The pad layer 104 may be a buffer layer between the substrate 102 and the fin top layer 106. In addition, the pad layer 104 may be used as a stop layer when the fin top layer 106 is removed. In some embodiments, the pad layer 104 is made of silicon oxide. In some embodiments, the fin top layer 106 is made of low-k materials such as SiCN, SiN, SiOC, SiOCN, other applicable low-k materials, or a combination thereof. Low-k material fin top layer 106 may not affect the device performance. In some embodiments, the fin top layer 106 is made of high-k materials such as $HfO_2$, $ZrO_2$, hafnium aluminate ($HfAlO_x$, where x may be a positive integer), hafnium silicate ($HfAlO_y$, where y may be a positive integer), other applicable high-k materials, or a combination thereof. High-k material fin top layer 106 may be more durable in the subsequent etching process and may protect the underlying films and structures.

The pad layer 104 and the fin top layer 106 may be formed by deposition processes, such as a chemical vapor deposition (CVD) process, a high-density plasma chemical vapor deposition (HDPCVD) process, a spin-on process, a sputtering process, or another applicable process.

Next, a middle pad layer 108 is blanketly formed over the fin top layer 106, and a hard mask layer 110 is blanketly formed over the middle pad layer 108 as shown in FIGS. 1A-1 and 1A-2 in accordance with some embodiments. The middle pad layer 108 may be made of silicon oxide. The hard mask layer 110 may be made of silicon oxide, silicon nitride, silicon oxynitride, or another applicable material. The middle pad layer 108 and the hard mask layer 110 are formed by deposition processes, such as a chemical vapor deposition (CVD) process, a high-density plasma chemical vapor deposition (HDPCVD) process, a spin-on process, a sputtering process, or another applicable process.

The middle pad layer 108 may be a buffer layer between the fin top layer 106 and the hard mask layer 110. In addition, the middle pad layer 108 may be used as a stop layer when the hard mask layer 110 is removed. In some embodiments, the middle pad layer 108 is not formed and the hard mask layer 110 is directly formed over the fin top layer 106.

Afterwards, a photoresist layer may be formed over the mask layer 110 (not shown). The photoresist layer is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

In some embodiments, after the photoresist layer is patterned, the pad layer 104, fin top layer 106, middle pad layer 108, and hard mask layer 110 are patterned by using the patterned photoresist layer as a mask. As a result, a patterned pad layer 104, a patterned fin top layer 106, a patterned middle pad layer 108, and a patterned hard mask layer 110 may be obtained. Afterwards, the patterned photoresist layer may be removed.

Figures 1, 1B:
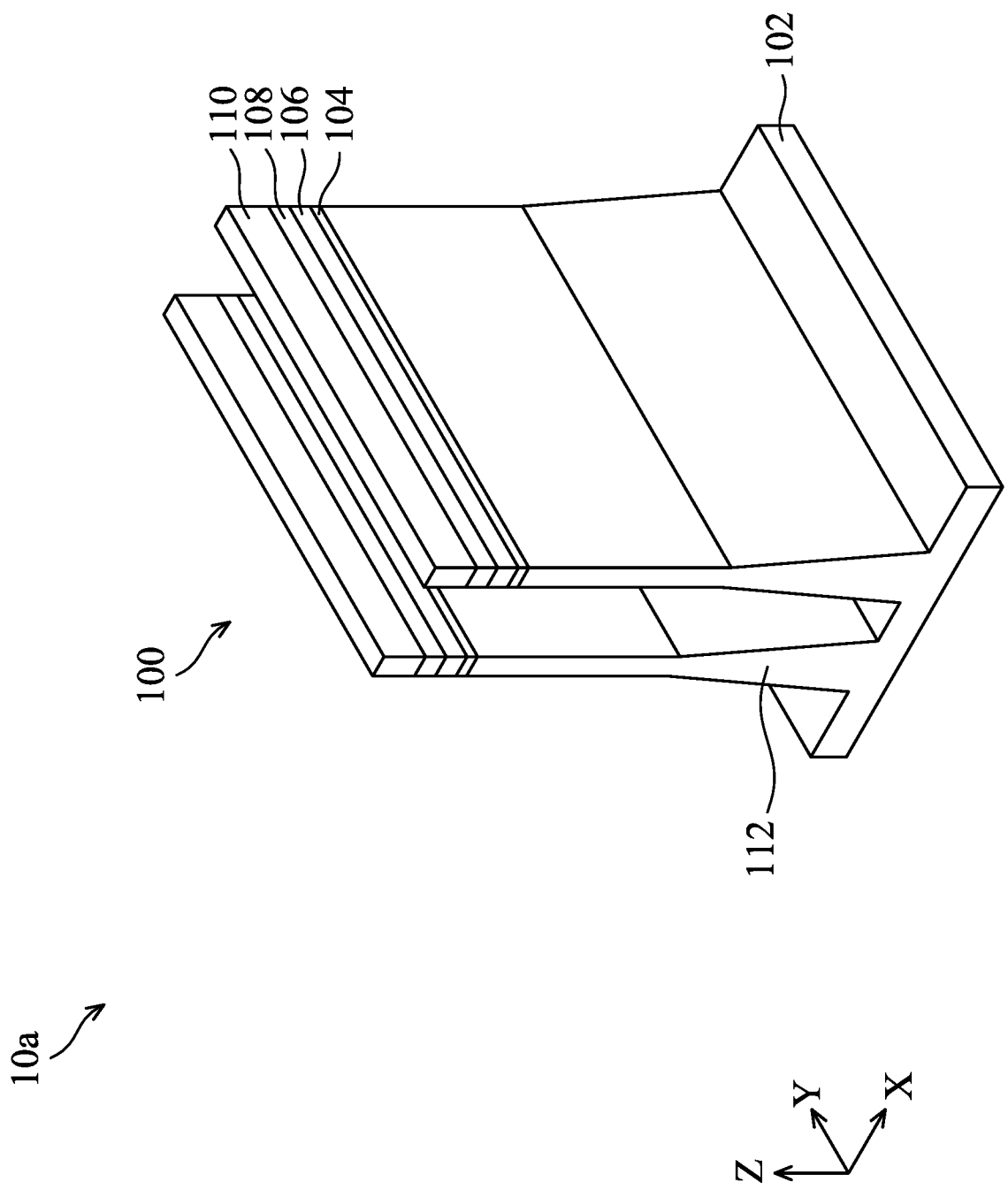
Figures 1, 1B, 2:
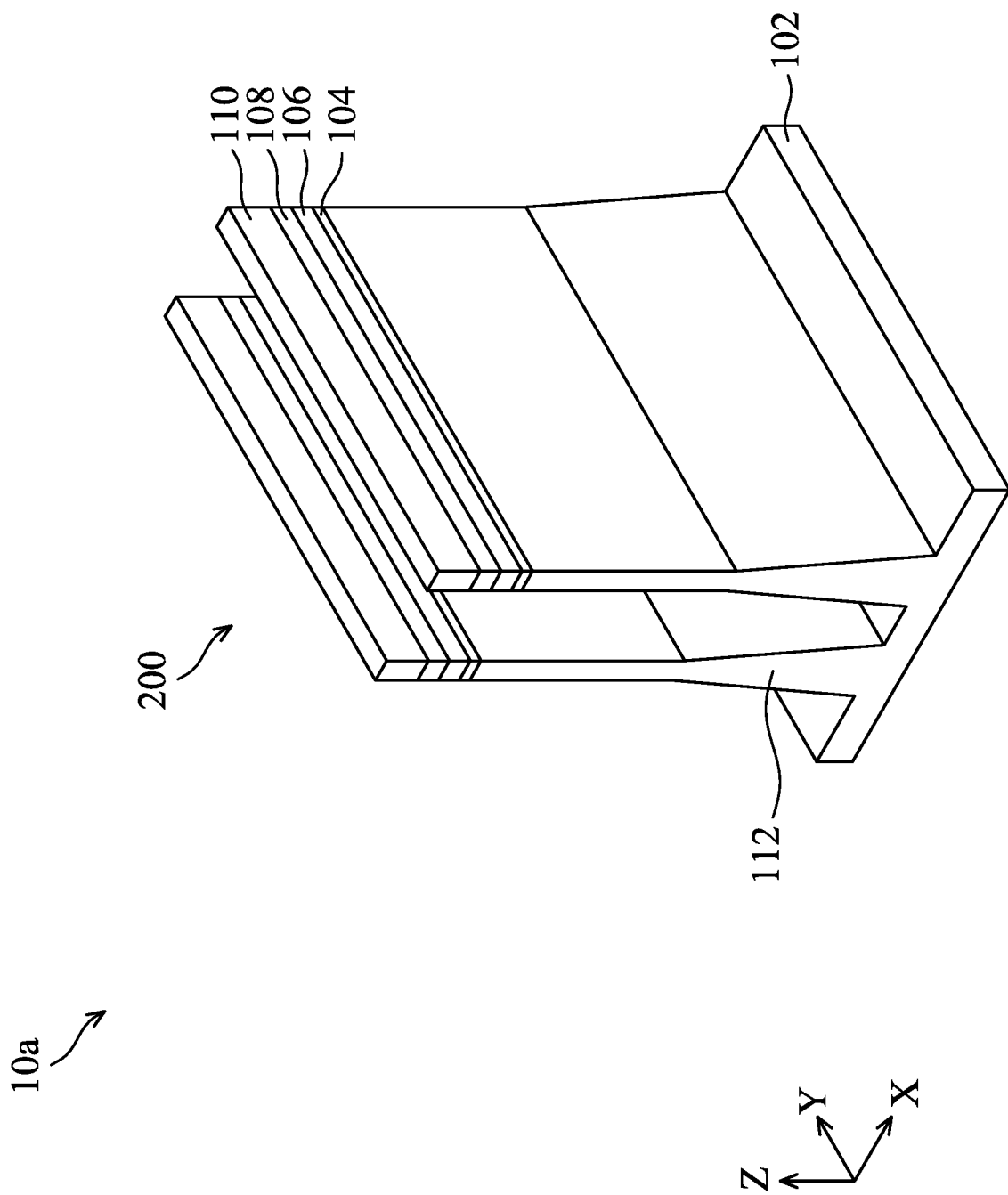

Afterwards, as shown in FIGS. 1B-1 and 1B-2 in accordance with some embodiments, an etching process is performed on the substrate 102 to form a fin structure 112 in the core region 100 and the I/O region 200 by using the middle pad layer 108 and the hard mask layer 110 as a mask. The etching process may be a dry etching process or a wet etching process. In some embodiments, the substrate 102 is etched by a dry etching process. The dry etching process includes using a fluorine-based etchant gas, such as $SF_6$, $C_xF_y$, (where x and y may be positive integers), $NF_3$, or a combination thereof. The etching process may be a time-controlled process, and continue until the fin structure 112 reaches a predetermined height. In some embodiments, the fin structure 112 has a width that gradually increases from the top portion to the base portion.

Figures 1, 1C:
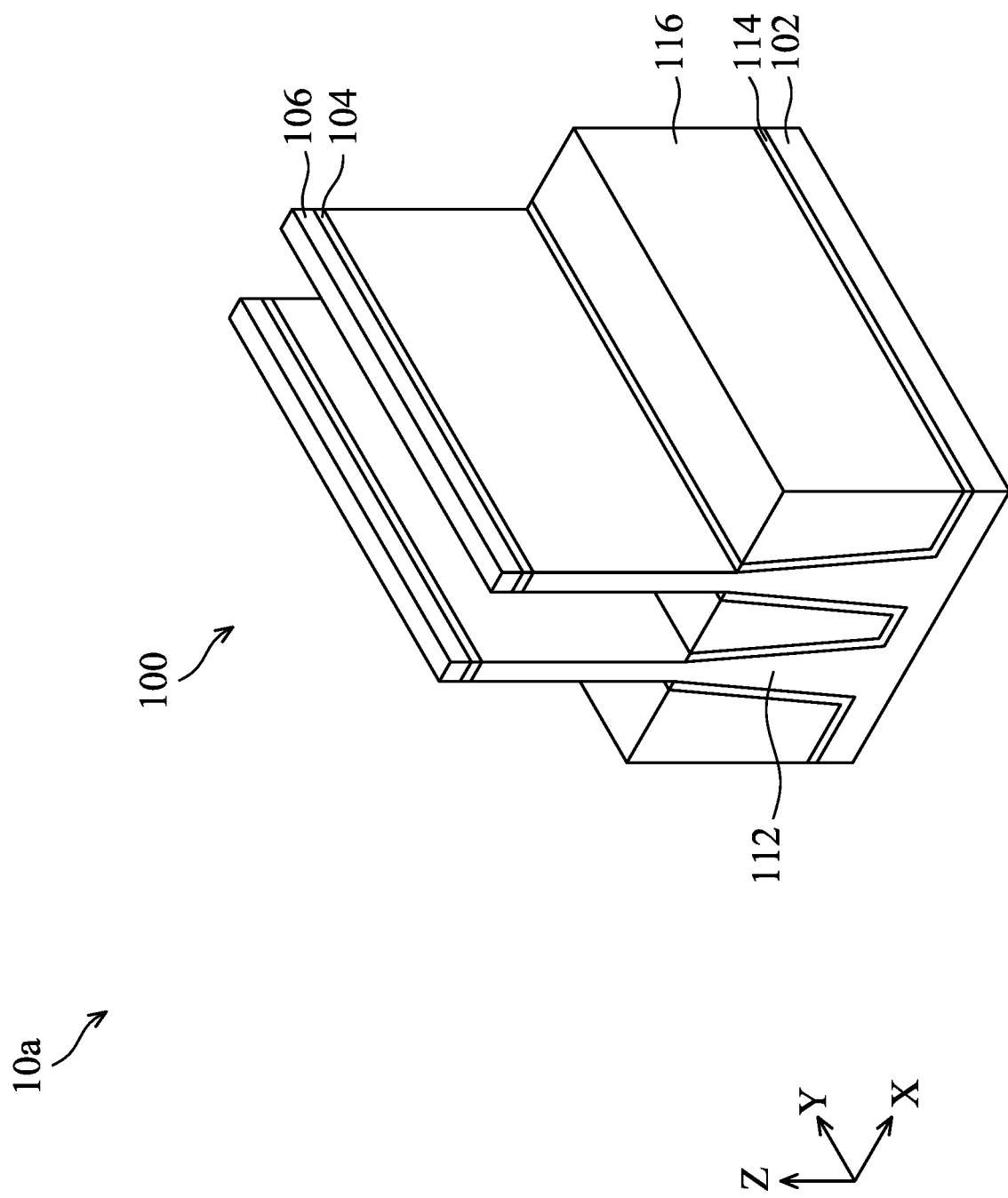
Figures 1, 1C, 2:
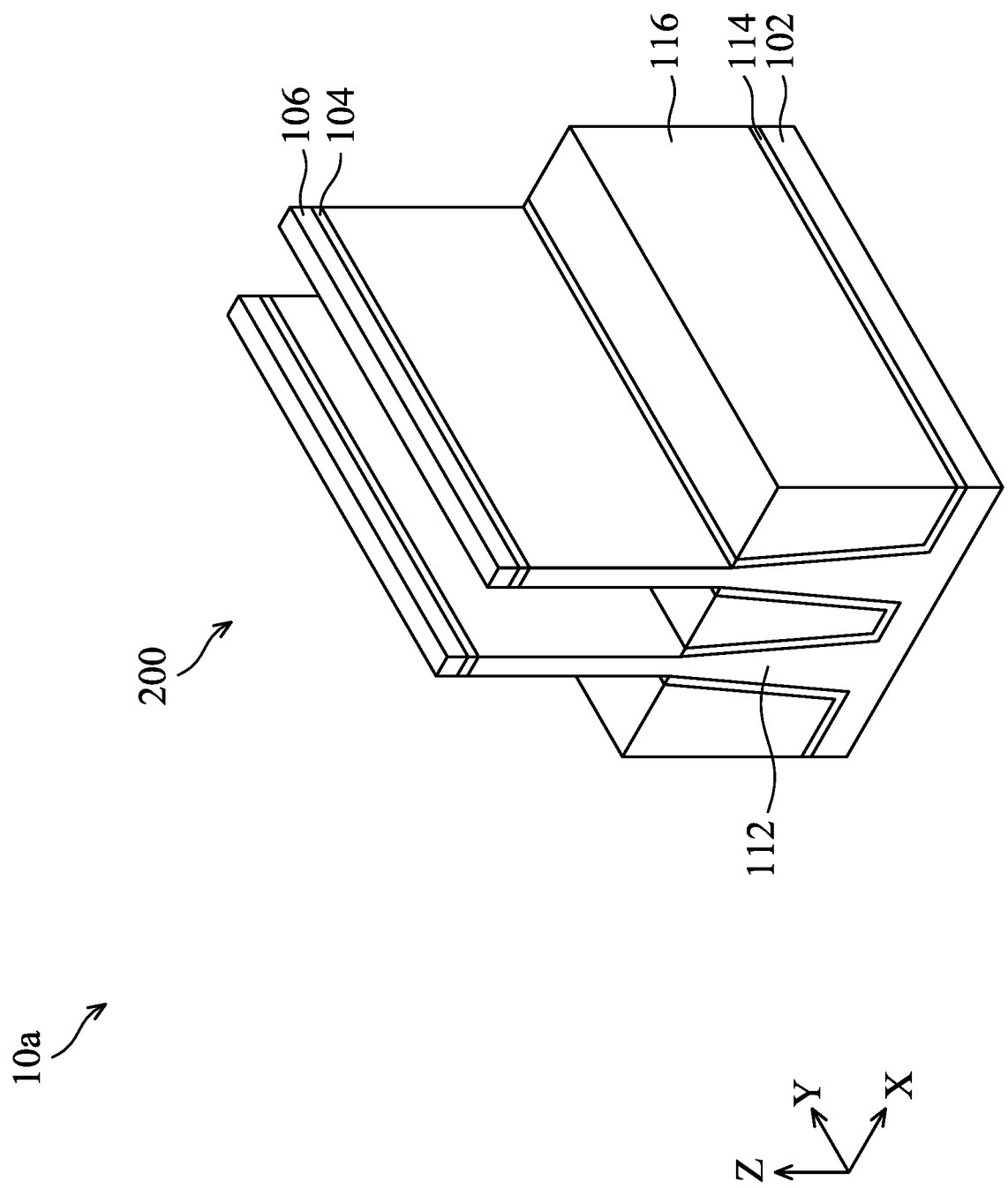

Next, as shown in FIGS. 1C-1 and 1C-2 in accordance with some embodiments, a liner layer 114 is conformally formed on the sidewalls and the top surface of the fin structure 112, the pad layer 104, the fin top layer 106, the middle pad layer 108, and hard mask layer 110. The liner layer 114 may be used to protect the fin structure 112 from being damaged in the following processes (such as an anneal process or an etching process). In some embodiments, the liner layer 114 is made of silicon nitride.

Next, as shown in FIGS. 1C-1 and 1C-2 in accordance with some embodiments, an isolation layer 116 is formed to cover the fin structure 112 and the substrate 102. In some embodiments, the isolation layer 116 is made of silicon oxide, silicon nitride, silicon oxynitride, fluoride-doped silicate glass (FSG), or another low-k dielectric material. The isolation layer 116 may be deposited by a deposition process, such as a chemical vapor deposition (CVD) process, a spin-on-glass process, or another applicable process.

Afterwards, in accordance with some embodiments, the isolation layer 116 is planarized to expose the top surface of the patterned mask layer 110. In some embodiments, the isolation layer 116 may be planarized by a chemical mechanical polishing (CMP) process.

Afterwards, as shown in FIGS. 1C-1 and 1C-2 in accordance with some embodiments, the patterned hard mask layer 110 is removed. In some embodiments, the patterned hard mask layer 110 is removed by a wet etching process. In some embodiments, the wet etching process includes using a phosphoric acid ($H_3PO_4$) etching solution.

Next, as shown in FIGS. 1C-1 and 1C-2 in accordance with some embodiments, an etching process is performed on the patterned middle pad layer 108, the liner layer 114 and the isolation layer 116. The etching process may be used to remove a portion of the liner layer 114 and a portion of the isolation layer 116. As a result, the top portion of the fin structure 112 may be exposed and the remaining isolation layer 116 may surround the base portion of the fin structure 112. The remaining isolation layer 116 may be an isolation structure 116 such as a shallow trench isolation (STI) structure surrounding the base portion of the fin structure 112. The isolation structure 116 may be configured to prevent electrical interference or crosstalk.

Figures 1, 1D:
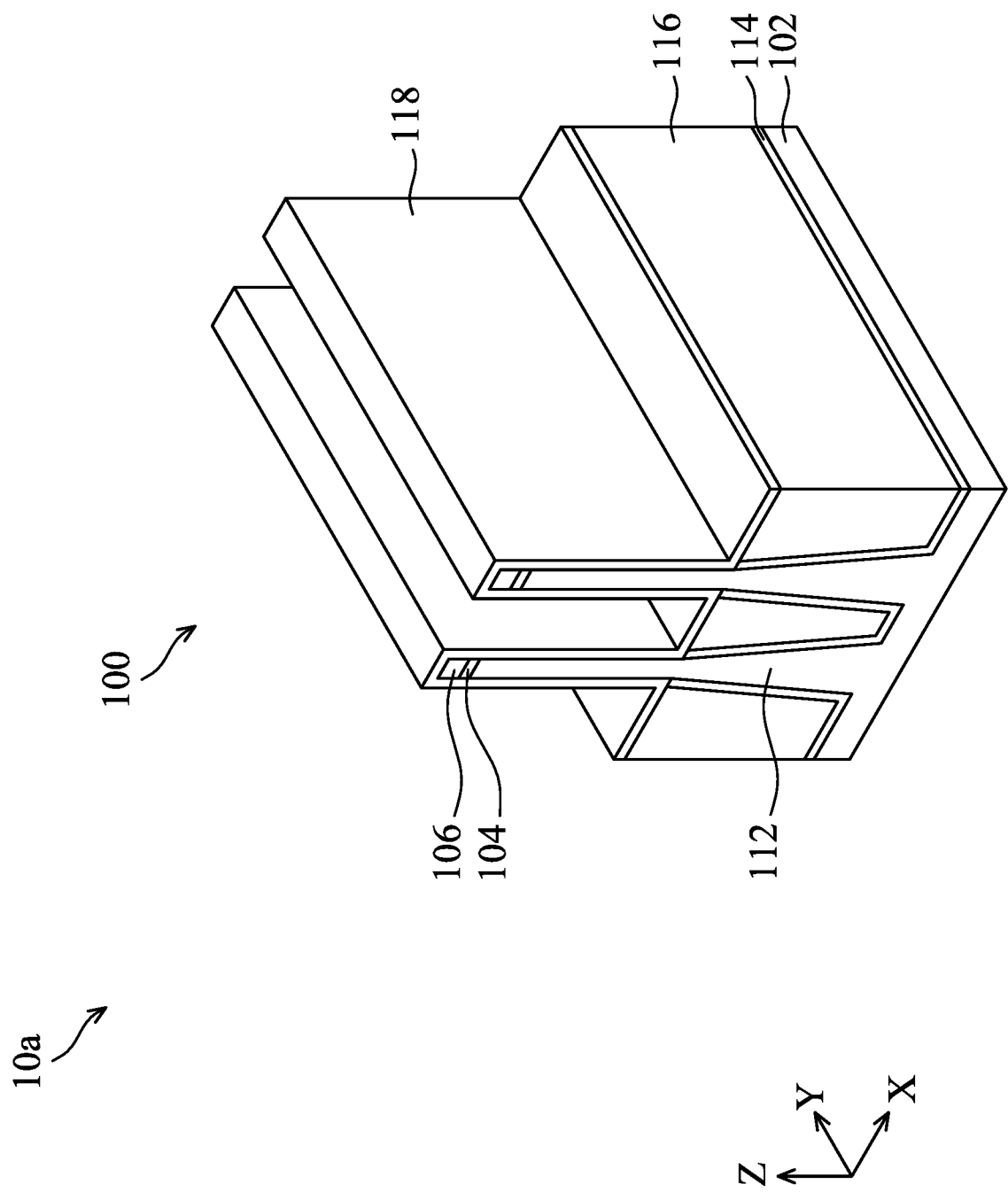
Figures 1, 1D, 2:
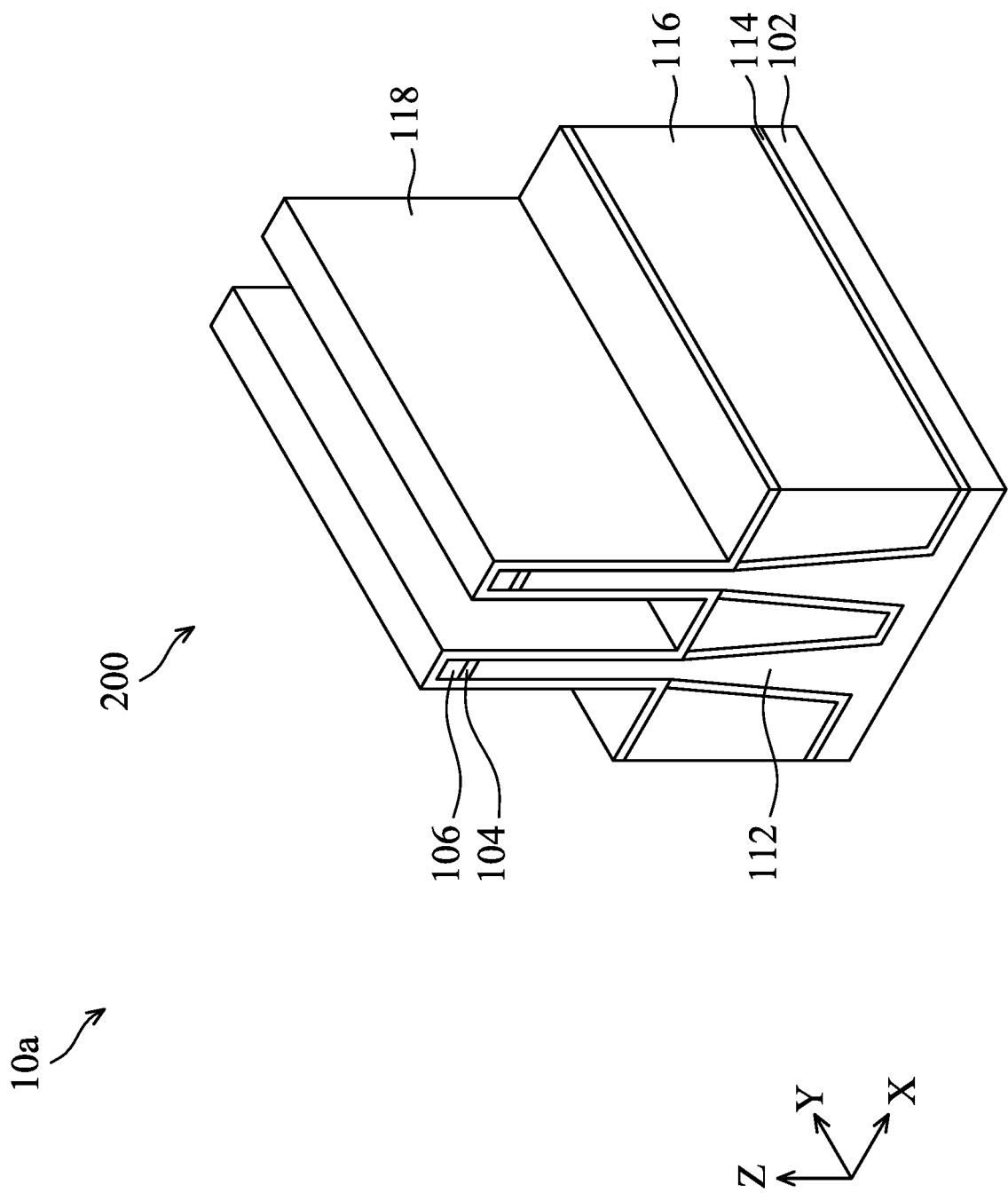

Next, as shown in FIGS. 1D-1 and 1D-2 in accordance with some embodiments, a dummy oxide layer 118 is conformally formed over and across the fin structure 112, the patterned pad layer 104, the patterned fin top layer 106, and the isolation layer 116 in the core region 100 and the I/O region 200. In some embodiments, the dummy oxide layer 118 may be made of dielectric materials, such as silicon oxide, silicon nitride, silicon oxynitride, dielectric material(s) with high dielectric constant (high-k), or a combination thereof. The dummy oxide layer 118 may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). In some embodiments, the dummy oxide layer 118 has a thickness of between 0.5 nm and 3 nm. If the dummy oxide layer 118 is too thick, it may be difficult to fill and remove a material in the space between the adjacent fin structures 112 in the following process. If the dummy oxide layer 118 is too thin, the underlying fin structure 112 may be damaged in the subsequent etching processes.

Figures 1, 1E:
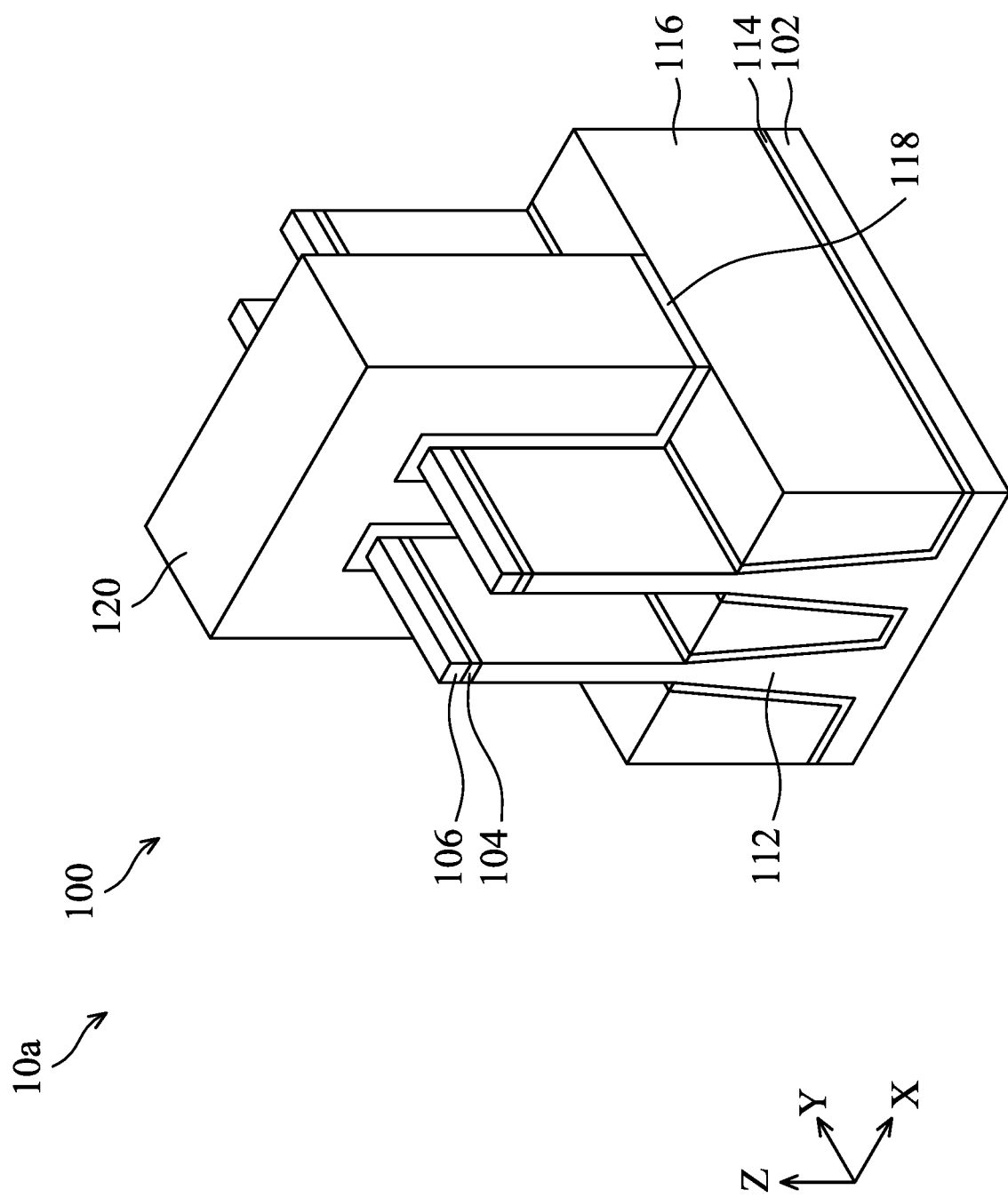
Figures 1, 1E, 2:
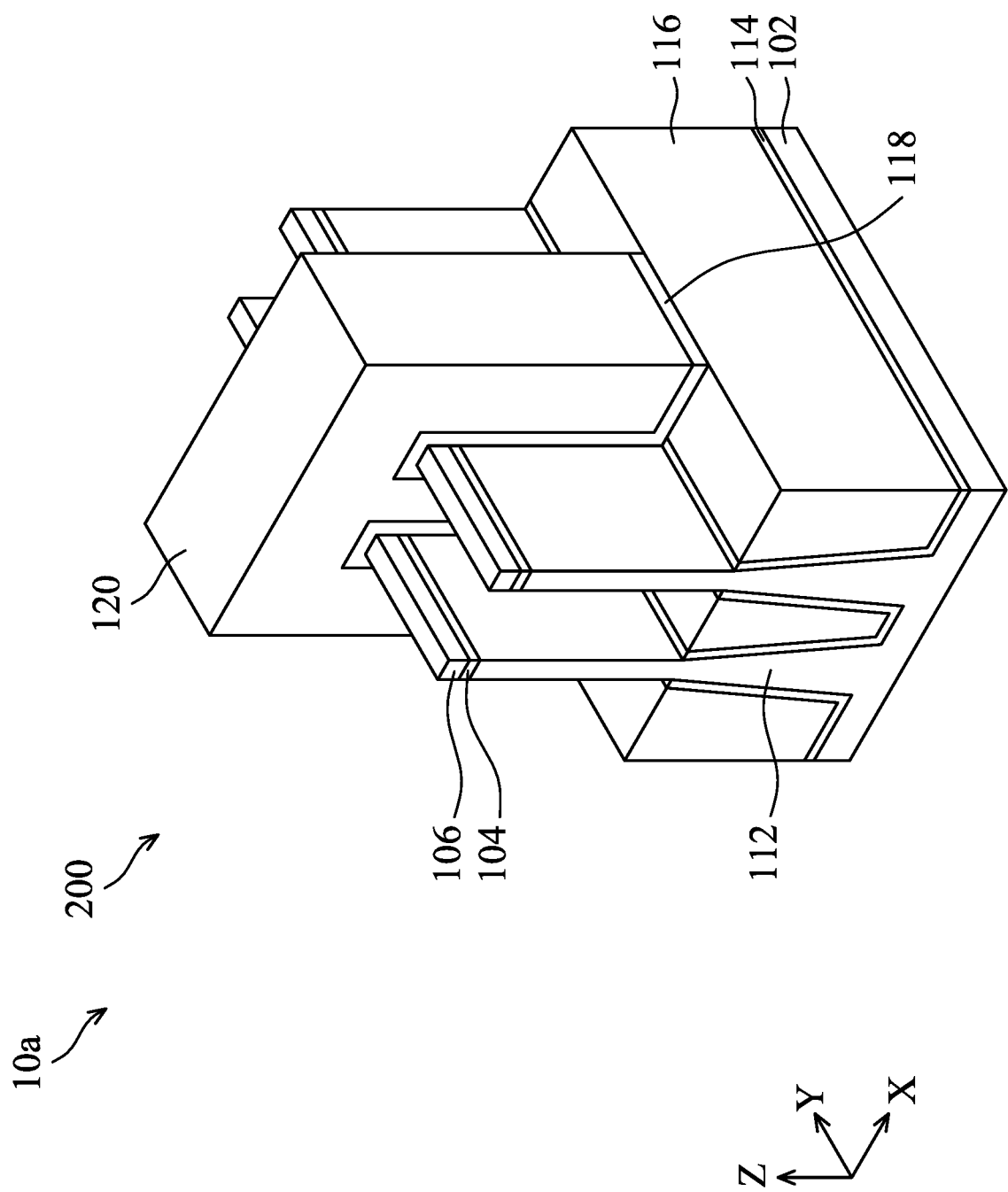

After forming the dummy oxide layer 118, as shown in FIGS. 1E-1 and 1E-2 in accordance with some embodiments, the dummy gate layer 120 is conformally formed over the dummy oxide layer 118. In some embodiments, the dummy gate layer 120 is made of polysilicon. The dummy gate layer 120 may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, as shown in FIGS. 1E-1 and 1E-2 in accordance with some embodiments, an etching process is performed on the dummy gate layer 120 to form a dummy gate structure 120 by using a patterned photoresist layer as a mask (not shown). The dummy oxide layer 118 may also be partially removed in the etching process. The etching process may be a dry etching process or a wet etching process. In some embodiments, the dummy gate layer and the dummy oxide layer 118 are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 112, the pad layer 104, and the fin top layer 106 may be exposed on the opposite sides of the dummy gate structure 120.

Figures 1, 1F:
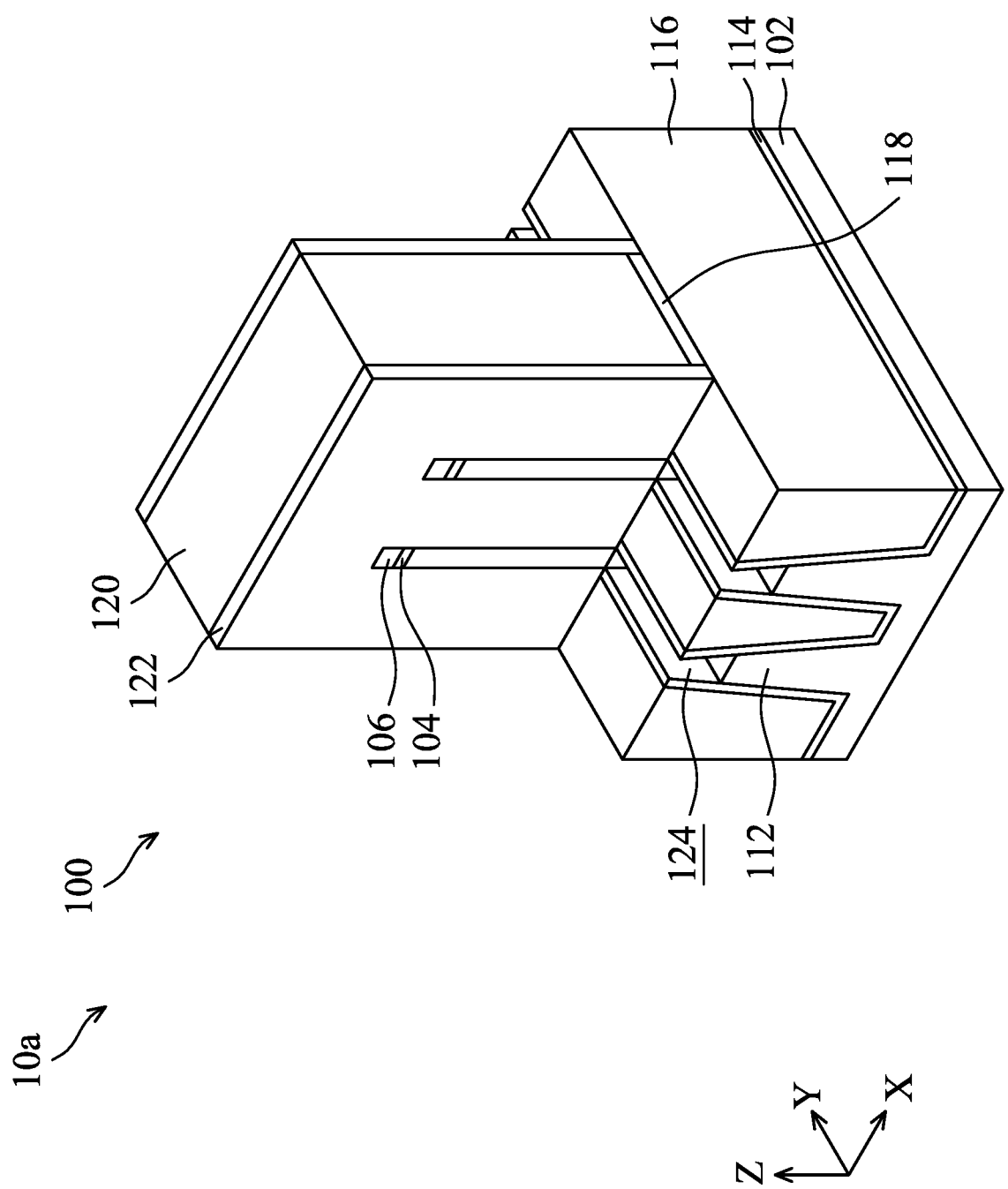
Figures 1, 1F, 2:
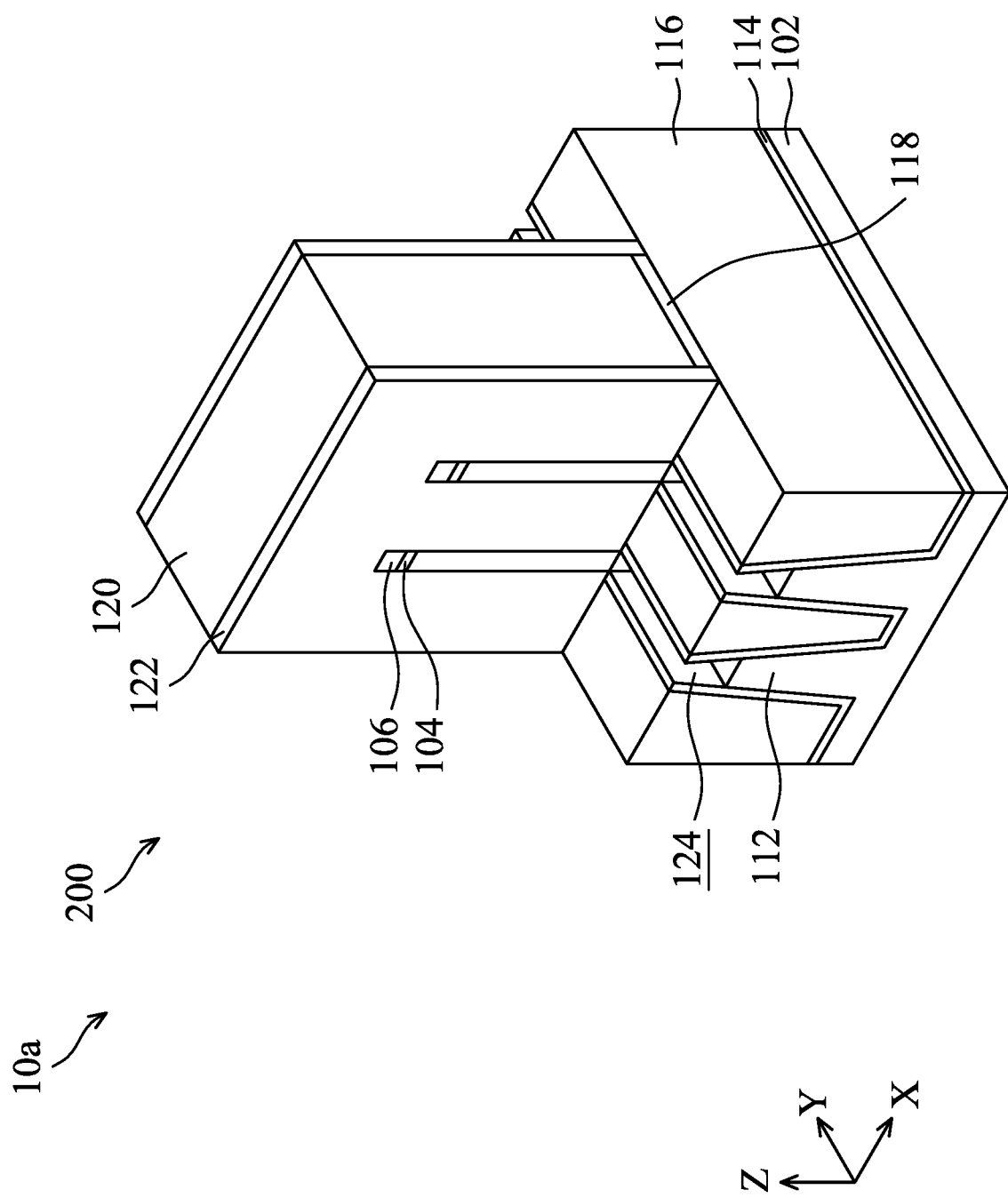

Next, as shown in FIGS. 1F-1 and 1F-2 in accordance with some embodiments, a pair of spacers 122 are formed on opposite sidewalls of the dummy gate structure 120. The spacers 122 may be made of silicon oxide, silicon nitride, silicon oxynitride, and/or dielectric materials. In some embodiments, the spacers 122 are formed by a chemical vapor deposition (CVD) process, a spin-on-glass process, or another applicable process.

Afterwards, as shown in FIGS. 1F-1 and 1F-2 in accordance with some embodiments, a top portion of the fin structure 112, the pad layer 104, and the fin top layer 106 exposed on the opposite sides of the dummy gate structure 120 are removed to form a recess 124 by an etching process. The etching process may include a dry etching process or a wet etching process. In some embodiments, the fin structure 112, the pad layer 104, and the fin top layer 106 are etched by a dry etching process. The dry etching process may include using a fluorine-based etchant gas, such as $SF_6$, $C_xF_y$ (where x and y may be positive integers), $NF_3$, or a combination thereof. In some embodiments, after the etching process, the recess 124 is formed and the top portion of the fin structure 112, the pad layer 104, and the fin top layer 106 are exposed from the spacers 122. As shown in FIGS. 1F-1 and 1F-2 in accordance with some embodiments, the top portion of the fin structure 112, the pad layer 104, and the fin top layer 106 protrude into the spacers 122.

Figures 1, 1G:
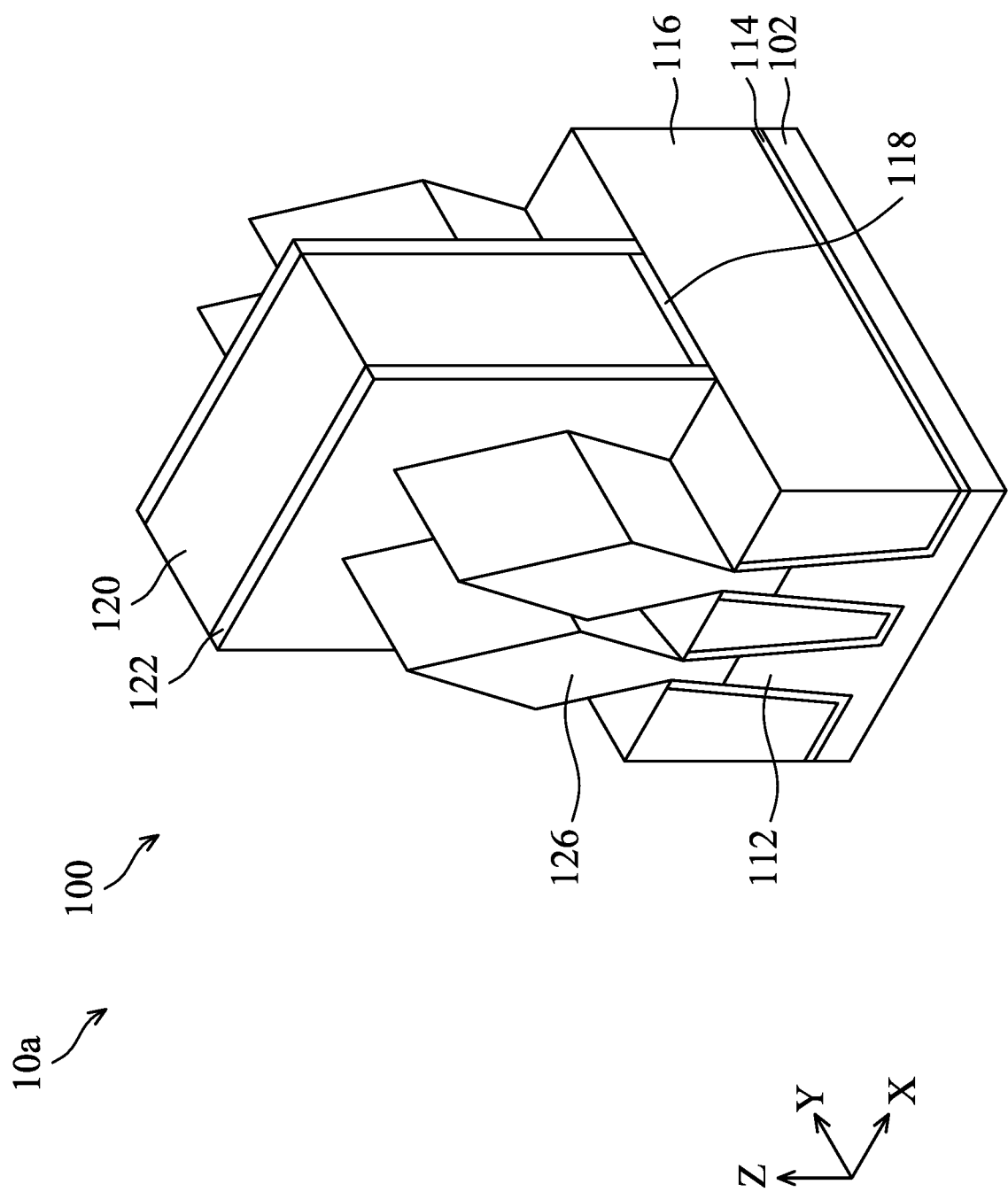
Figures 1, 1G, 2:
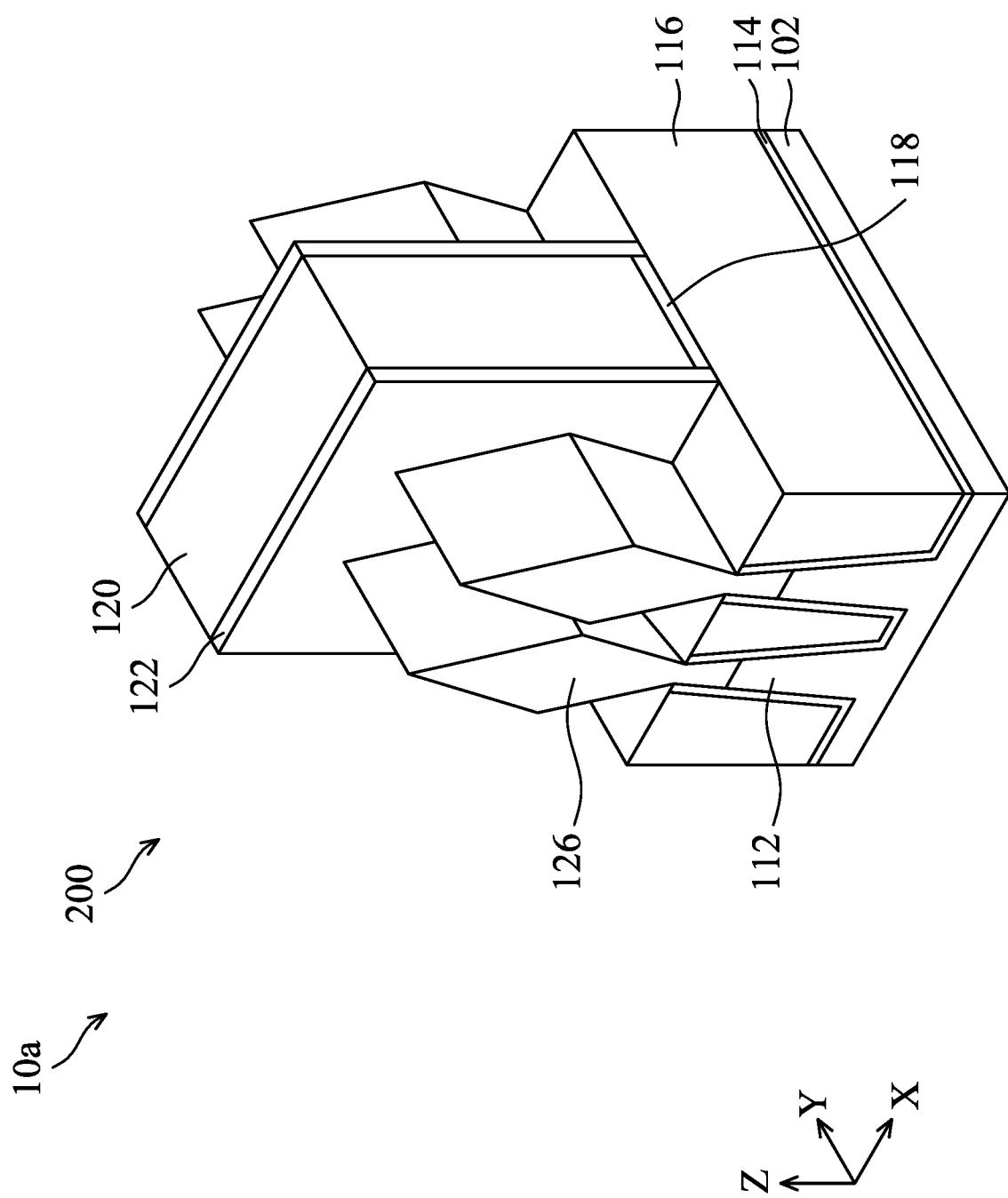

Next, as shown in FIGS. 1G-1 and 1G-2 in accordance with some embodiments, a source/drain (S/D) structure 126 are formed in the recess 124 over the fin structure 112. In some embodiments, a strained material is grown in the recess 124 by an epitaxial (epi) process to form the S/D structure 126. In addition, the lattice constant of the strained material may be different from the lattice constant of the substrate 102. In some embodiments, the S/D structure 126 may include Ge, SiGe, InAs, InGaAs, InSb, GaAs, GaSb, InAlP, InP, SiC, SiP, other applicable materials, or a combination thereof. In some embodiments, the S/D structure 126 is formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

Figures 1, 1H:
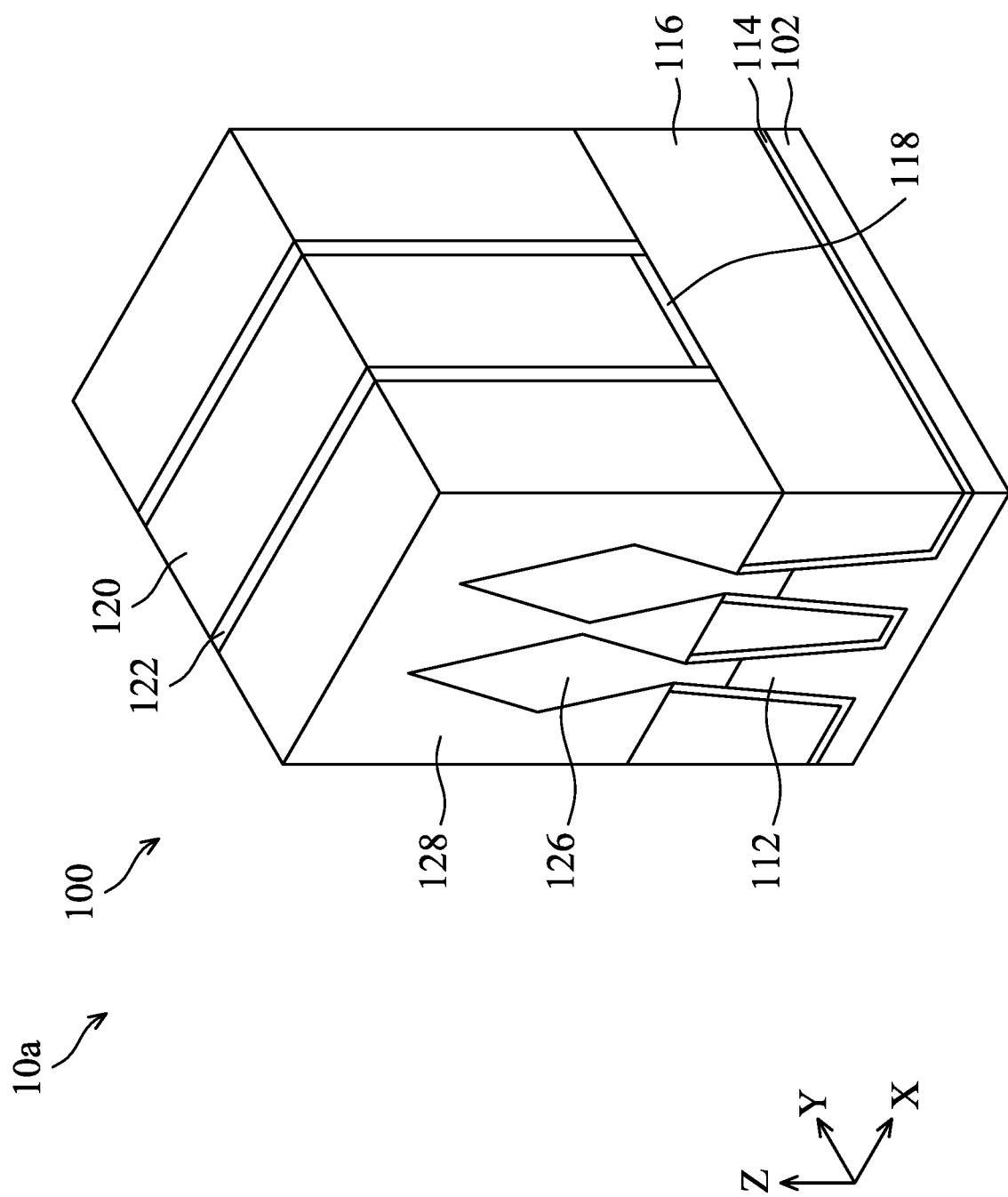
Figures 1, 1H, 2:
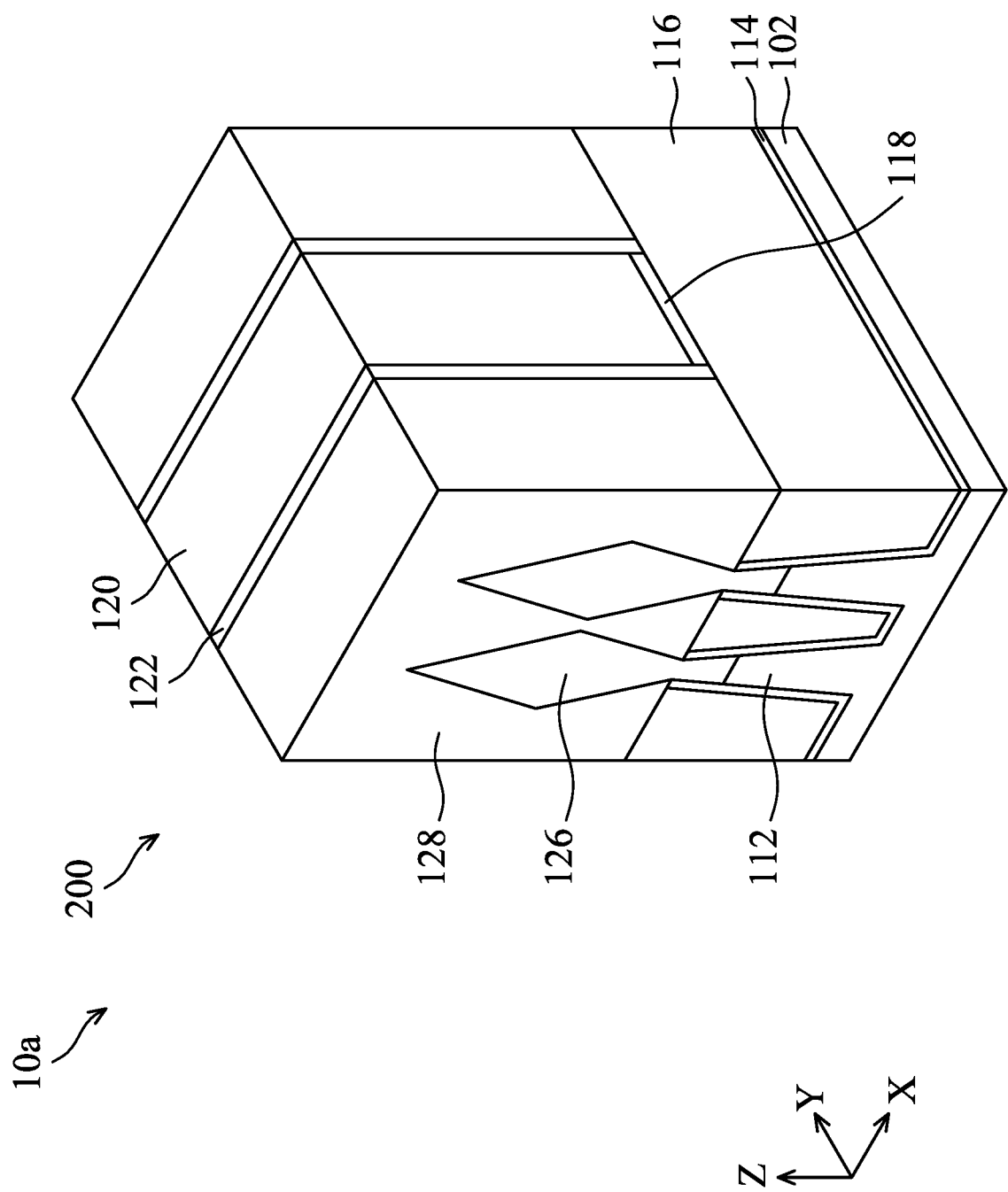

After the S/D structure 126 is formed, as shown in FIGS. 1H-1 and 1H-2 in accordance with some embodiments, an inter-layer dielectric (ILD) structure 128 is formed to cover the S/D structure 126. The inter-layer dielectric structure 128 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric structure 128 may be formed by chemical vapor deposition (CVD), spin-on coating, or other applicable processes.

Afterwards, a planarizing process is performed on the ILD structure 128 until the top surface of the dummy gate structure 120 is exposed, as shown in FIGS. 1H-1 and 1H-2 in accordance with some embodiments. After the planarizing process, the top surface of the dummy gate structure 120 may be substantially level with the top surfaces of the spacers 122 and the ILD structure 128. In some embodiments, the planarizing process includes a grinding process, a chemical mechanical polishing (CMP) process, an etching process, another applicable process, or a combination thereof.

Figures 1, 1I:
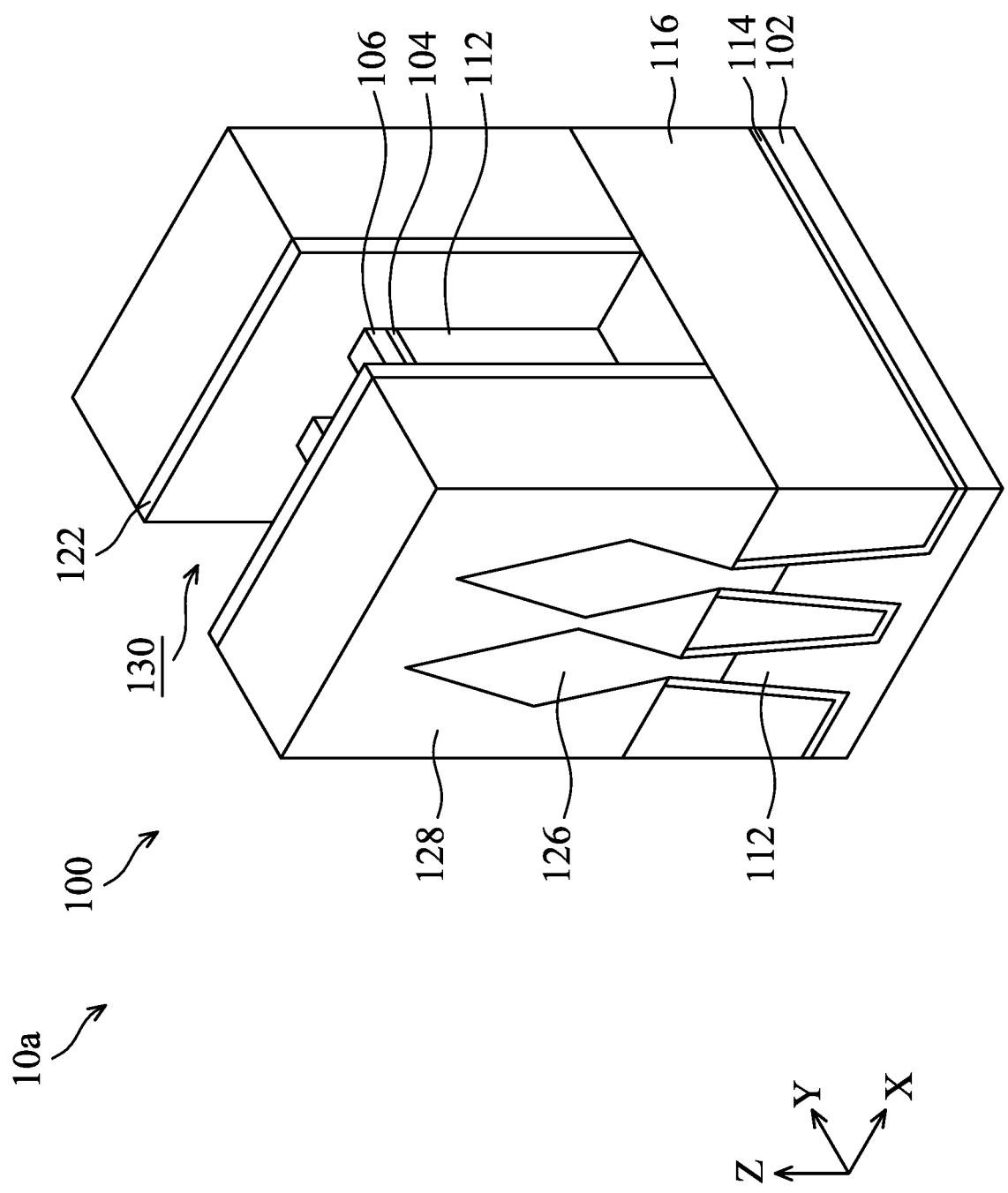
Figures 1, 1I, 2:
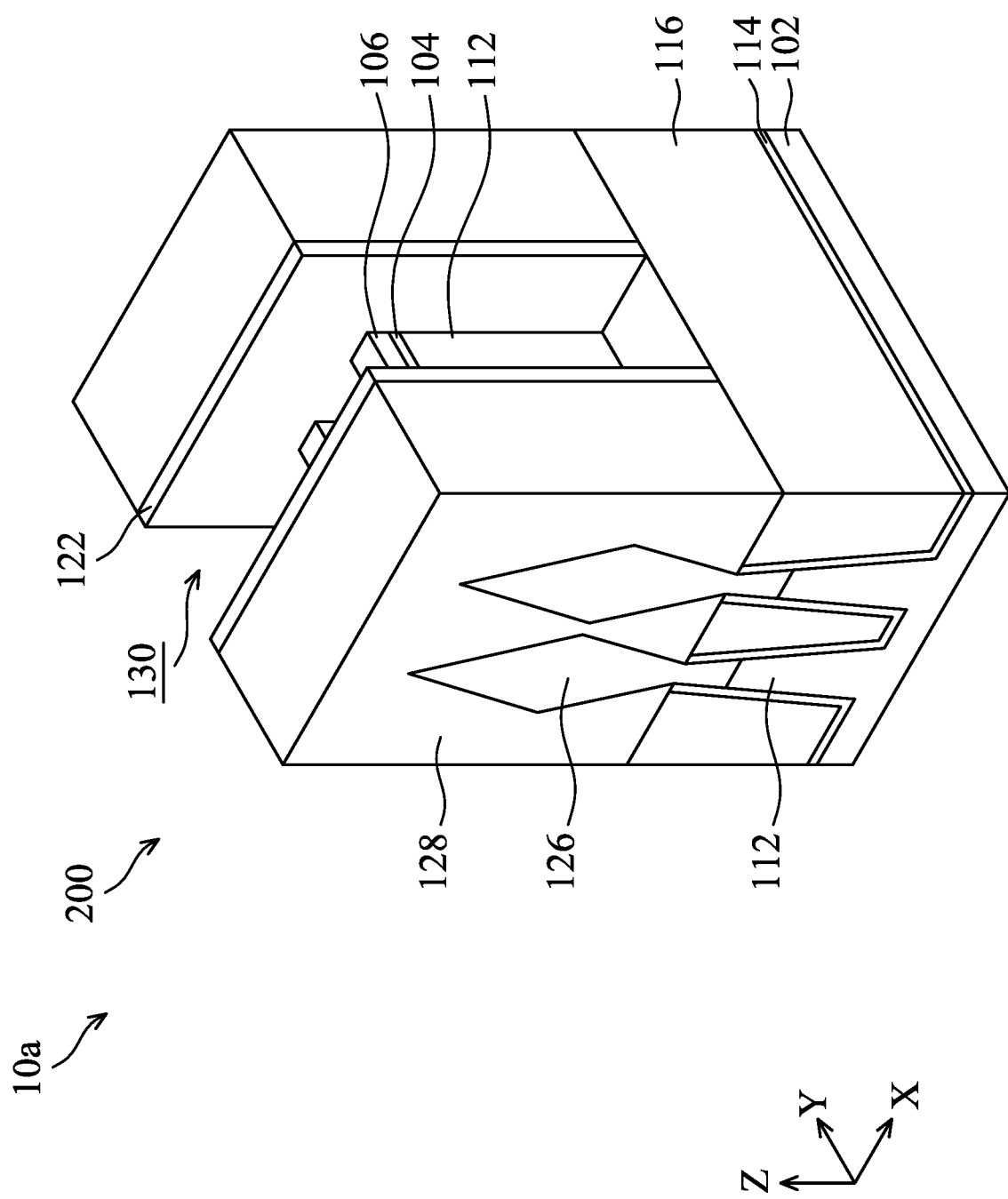

Next, the dummy gate structure 120 is removed to form a trench 130 between the spacers 122 in the core region 100 and the I/O region 200, as shown in FIGS. 1I-1 and 1I-2 in accordance with some embodiments. The fin structure 112, the pad layer 104, and the fin top layer 106 may be exposed form the trench 130. The dummy gate structure 120 and the dummy oxide layer 118 may be removed by an etching process, such as a dry etching process or a wet etching process. The fin top layer 106 over the fin structure 112 may protect the fin structure 112 in the core region 100 and the I/O region 200 from damage in the etching process.

Figures 1, 1J:
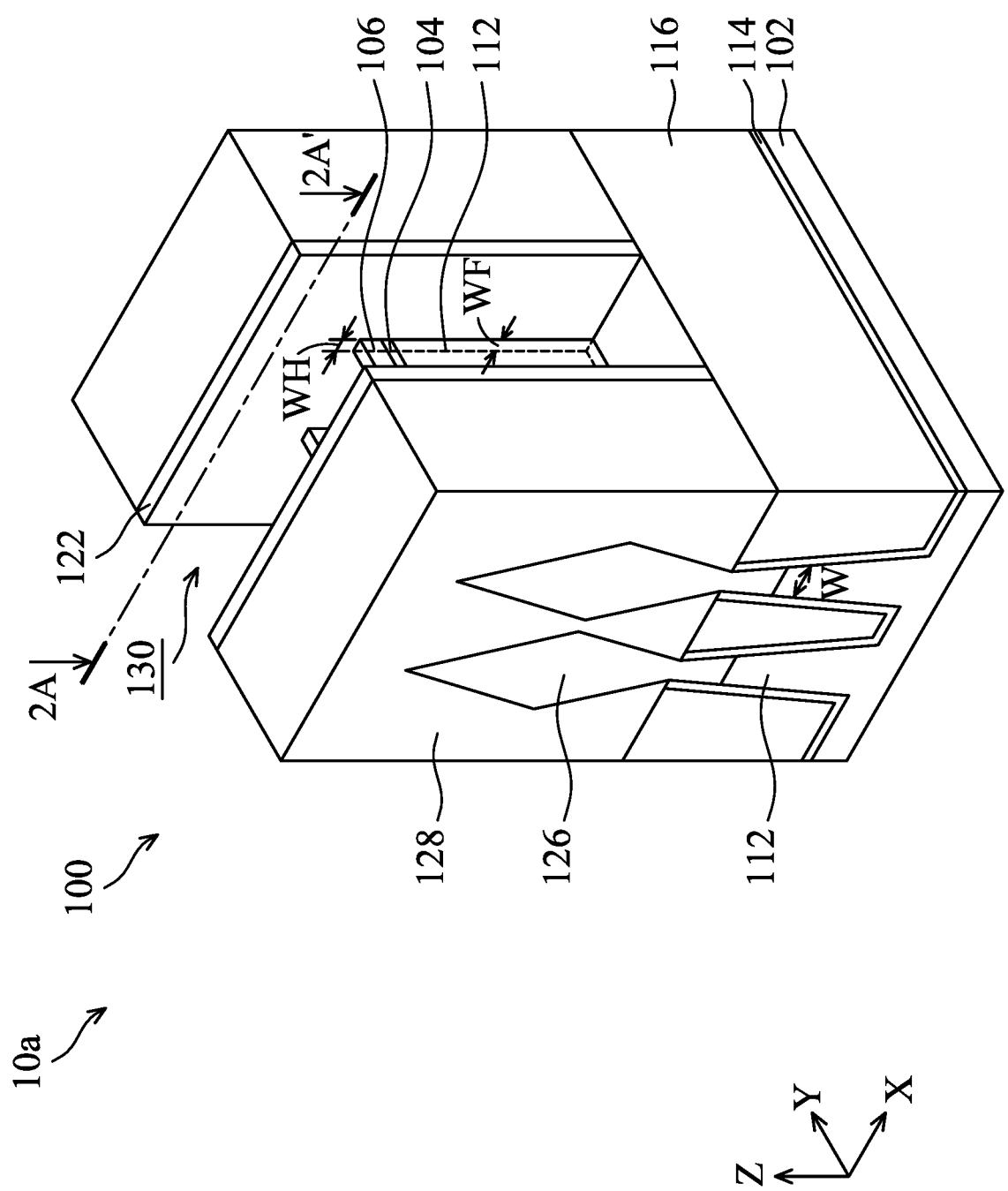
Figures 1, 1J, 2:
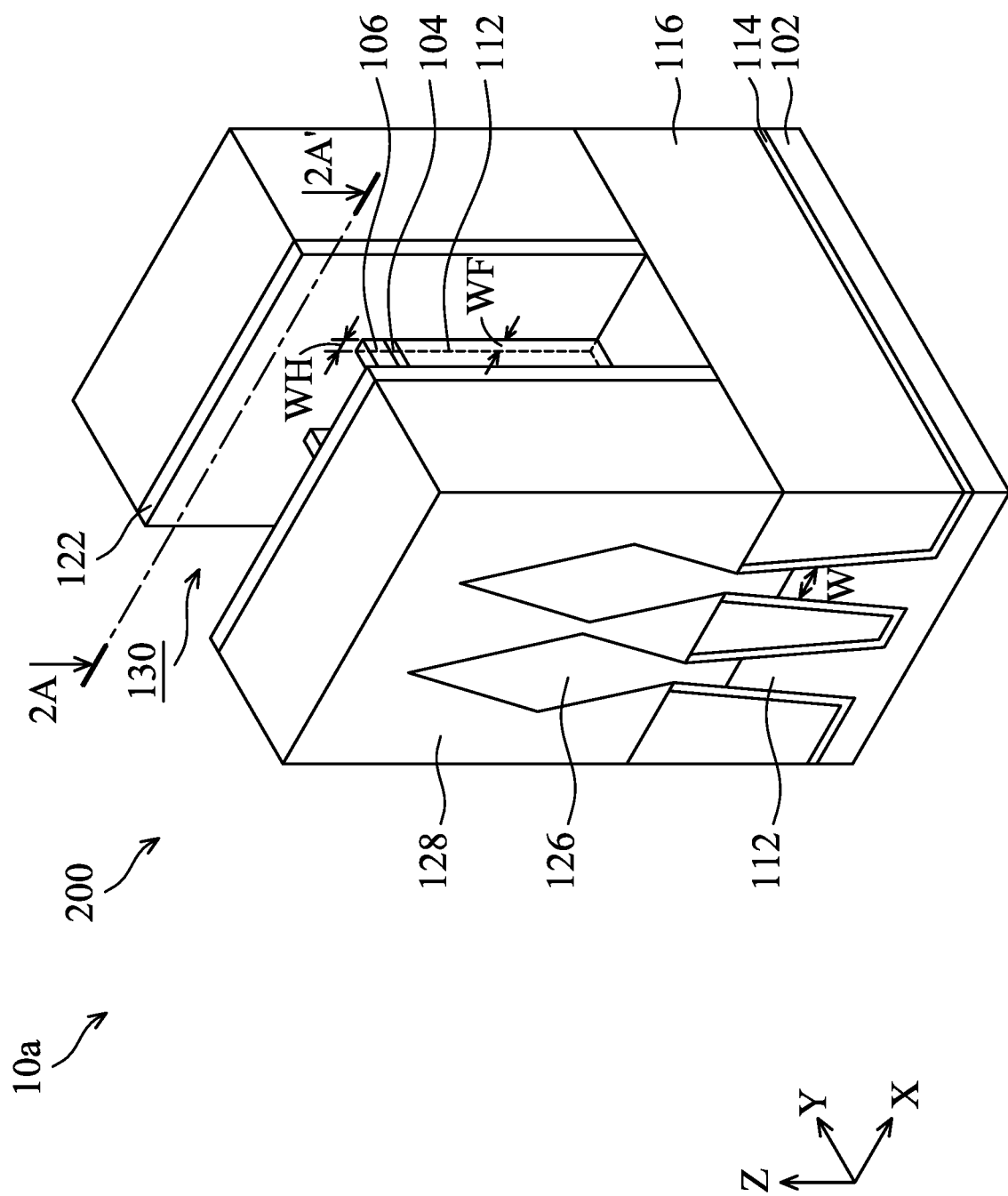

Next, the fin structure 112, the pad layer 104, and the fin top layer 106 in the trench 130 are trimmed in the core region 100 and the I/O region 200, as shown in FIGS. 1J-1 and 1J-2 in accordance with some embodiments. The width of the fin structure 112, the pad layer 104, and the fin top layer 106 in the trench 130 may be reduced in the trimming process. The fin structure 112, the pad layer 104, and the fin top layer 106 may be trimmed by an etching process, such as a dry etching process or a wet etching process. In some embodiments, the fin structure 112, the pad layer 104, and the fin top layer 106 are trimmed by a wet etching process. The wet etching process may be performed in wet etching etchant including tetramethylammonium hydroxide (TMAH), diluted hydrofluoric acid (DHF), potassium hydroxide (KOH), ammonia, hydrofluoric acid (HF), nitric acid (HNO3), and/or acetic acid (CH3COOH), other suitable wet etching etchant, or a combination thereof.

After trimming the fin structure 112, the pad layer 104, and the fin top layer 106 as shown in FIGS. 1J-1 and 1J-2 in accordance with some embodiments, the width WF of the fin structure 112 in the trench 130 is narrower than the width W of the fin structure 112 under in the S/D region. Therefore, it may be easier for filling a gate material in the space between adjacent fin structures 112 in the subsequent steps. In some embodiments, the fin width is the dimension in a direction X perpendicular to the longitudinal direction Y of the fin structure 112.

FIGS. 2A-1 and 2A-2 shows cross-sectional representations of the FinFET device structure 10a shown in FIGS. 1J-1 and 1J-2 respectively. FIGS. 2A-1 and 2A-2 show cross-sectional representations taken along line 2A-2A' in FIGS. 1J-1 and 1J-2 respectively. FIGS. 2A-1 and 2A-2 are cross-sections of the fin structure 112 in the channel region of the FinFET device structure 10a. After trimming the fin structure 112 in the trench 130 in both the core region 100 and the I/O region 200, as shown in FIGS. 2A-1 and 2A-2 in accordance with some embodiments, the fin structure 112 includes a base portion 112B surrounded by the isolation structure 116, a top portion 112T exposed from the isolation structure 116, and a joint portion 112J connecting the base portion 112B and the top portion 112T. In some embodiments, the surface of the joint portion 112J of the fin structure 112 is aligned with the top surface 116S of the isolation structure 116, and the sidewall of the top portion 112T of the fin structure 112 is misaligned with the sidewall of the bottom portion 112B of the fin structure 112. In some embodiments, the top portion 112T of the fin structure 112 is misaligned with the bottom portion 112B, and the difference of the fin width WF of the top portion 112T and the fin width WFB of the bottom portion 112B of the fin structure 112 is in a range from about 2 nm to about 6 nm. If the top portion 112T is aligned with the bottom portion 112B, the width WF of the top portion 112T may be to too wide and may be difficult for subsequent gate gap filling process. If the difference of the fin width WF of the top portion 112T and the fin width WFB of the bottom portion 112B of the fin structure 112 is too much, the width WF of the top portion 112T may be to too narrow and may cause short channel effect. Moreover, the slope of the surface of the joint portion 112J of the fin structure 112 is less than the slope of the sidewalls of the top portion 112T of the fin structure 112 and the slope of the sidewalls of the bottom portion 112B of the fin structure 112.

In addition, in some embodiments, the width WH of the fin top layer 106 and the pad layer 104 in the trench 130 is less than or equal to the width WF of the fin structure 112 in the trench 130. If the width WH of the fin top layer 106 and the pad layer 104 in the trench 130 is wider than the width WF of the fin structure 112 in the trench 130, the space between adjacent fin structures 112 may be too small, and it may make the subsequent gate material filling process more difficult.

In some embodiments as shown in FIGS. 1J-1 and 1J-2, the fin structure 112 in the trench 130 in both the core region 100 and the I/O region 200 are trimmed by the same etching process. In some embodiments, the fin structures 112 in the trench 130 in the core region 100 and the I/O region 200 are trimmed by separated etching processes. Therefore, as shown in FIGS. 2A-1 and 2A-2 in accordance with some embodiments, the width WF of the fin structures 112 in the core region 100 and the I/O region 200 may be different. By trimming the fin structures 112 in the trench 130 in the core region 100 and the I/O region 200 by separated etching processes, desired width WF of the fin structures 112 in both the core region 100 and the I/O region 200 may be achieved respectively. In some embodiments, the difference of the width of the fin structures 112 in the trench 130 in the core region 100 and the I/O region 200 is in a range from about −15% to +15%. If the difference of the width WF of the fin structure 112T in the core region 100 and the I/O region 200 is significant, it may be difficult for subsequent gate gap filling process for the wider fin structure 112.

Figures 1, 1K:
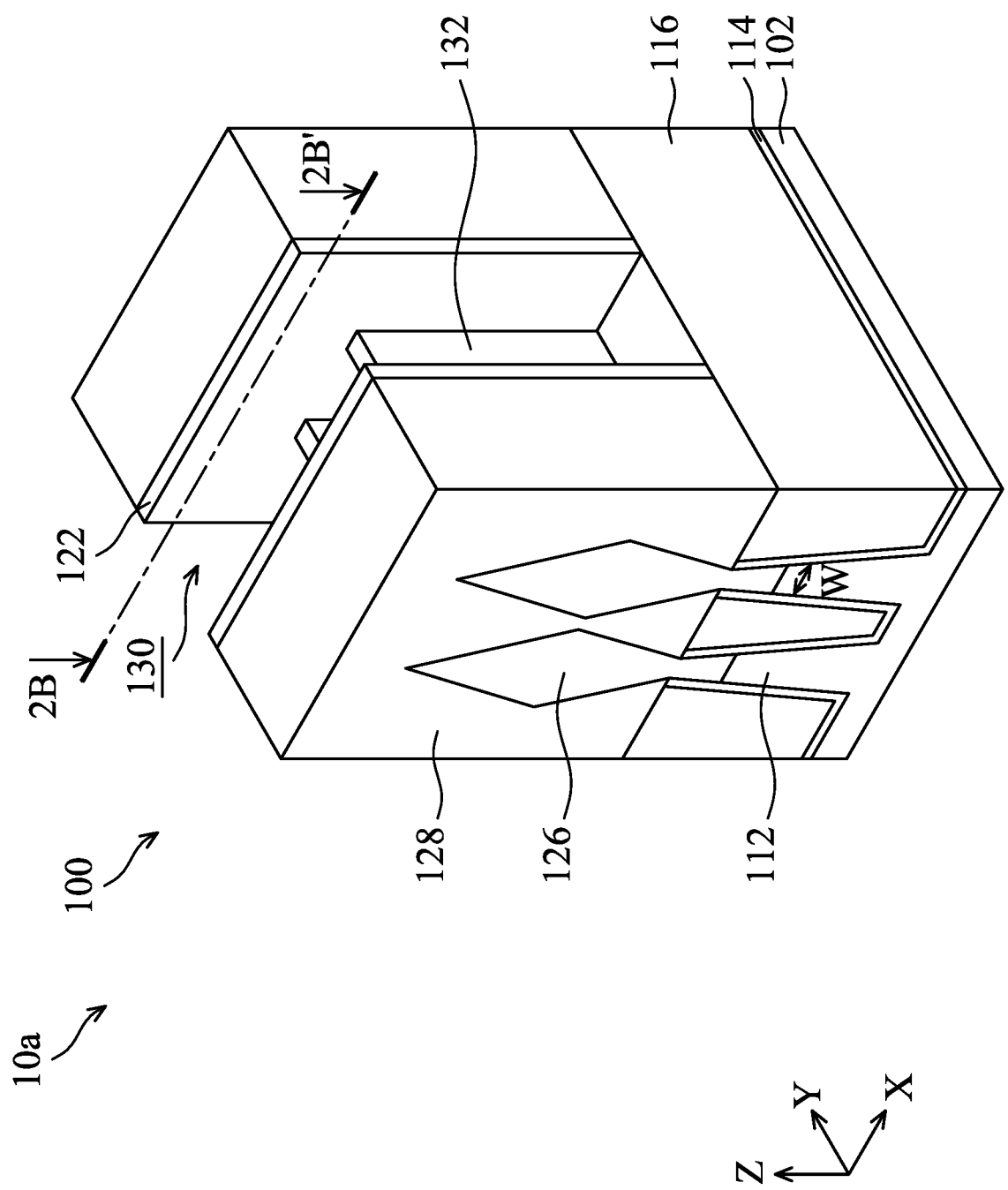
Figures 1, 1K, 2:
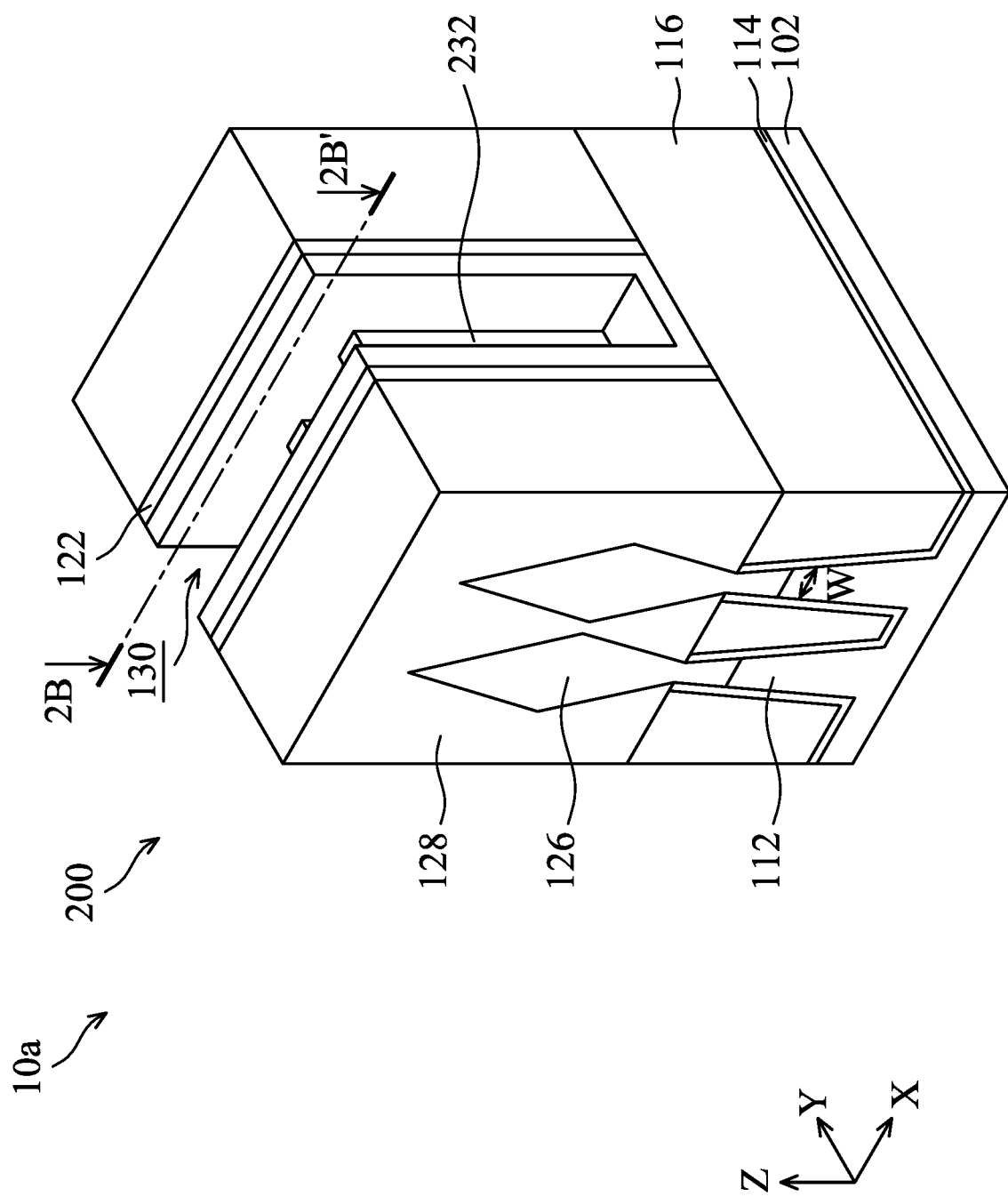

Next, a first oxide layer 132 is formed across the fin structure 112, the pad layer 104, and the fin top layer 106 in the core region 100, and a second oxide layer 232 is formed over the fin structure 112, the pad layer 104, and the fin top layer 106 in the I/O region 200, as shown in FIGS. 1K-1 and 1K-2 in accordance with some embodiments. In some embodiments, the first oxide layer 132 and the second oxide layer 232 may include silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. In some embodiments, the first oxide layer 132 and the second oxide layer 232 may be thermally grown using a thermal oxidation process in oxygen-containing ambient or nitrogen-containing ambient (e.g. NO or $N_2O$).

FIGS. 2B-1 and 2B-2 shows cross-sectional representations of the FinFET device structure 10a shown in FIGS. 1K-1 and 1K-2 respectively. FIGS. 2B-1 and 2B-2 show cross-sectional representations taken along line 2B-2B' in FIGS. 1K-1 and 1K-2. FIGS. 2B-1 and 2B-2 are cross-sections of the fin structure 112 in the channel region of the FinFET device structure 10a. In some embodiments as shown in FIGS. 2B-1 and 2B-2, the second oxide layer 232 formed in the I/O region 200 is thicker than the first oxide layer 132 formed in the core region 100. In some embodiments, the first oxide layer 132 is formed by a chemical oxidation process, therefore, the first oxide layer 132 is formed over the top surface and the sidewalls of the exposed fin structure 112, the pad layer 104, and the fin top layer 106 in the core region 100. In some embodiments, the second oxide layer 232 is formed by a deposition process, therefore, the second oxide layer 232 is formed over the top surface of the isolation structure 116 as well as the top surface and the sidewalls of the exposed fin structure 112, the pad layer 104, and the fin top layer 106 in the I/O region 200. Moreover, the second oxide layer 232 may directly contact the joint portion 112J of the fin structure 112 in the I/O region 200 while the joint portion 112J of the fin structure 112 in the core region 100 is exposed. In some embodiments, since the fin structures 112 are trimmed in both the core region 100 and the I/O region 200, the space between adjacent fin structures 112 may be enlarged, and the first oxide layer 132 and the second oxide layer 232 may be thicker than when the fin structure 112 is not trimmed. Therefore, the reliability of the FinFET device structure 10a may be improved.

Figures 1, 1L:
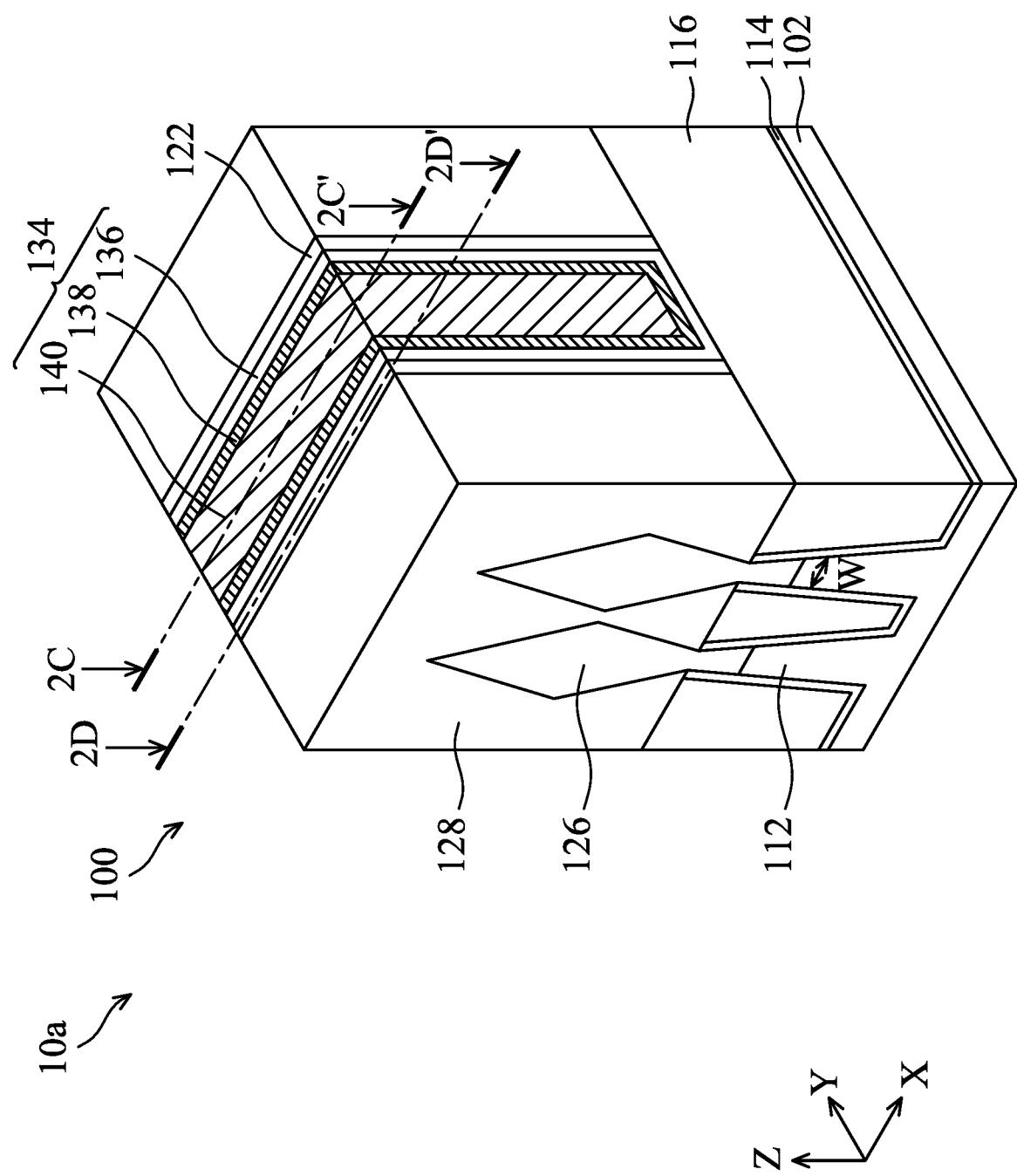
Figures 1, 1L, 2:
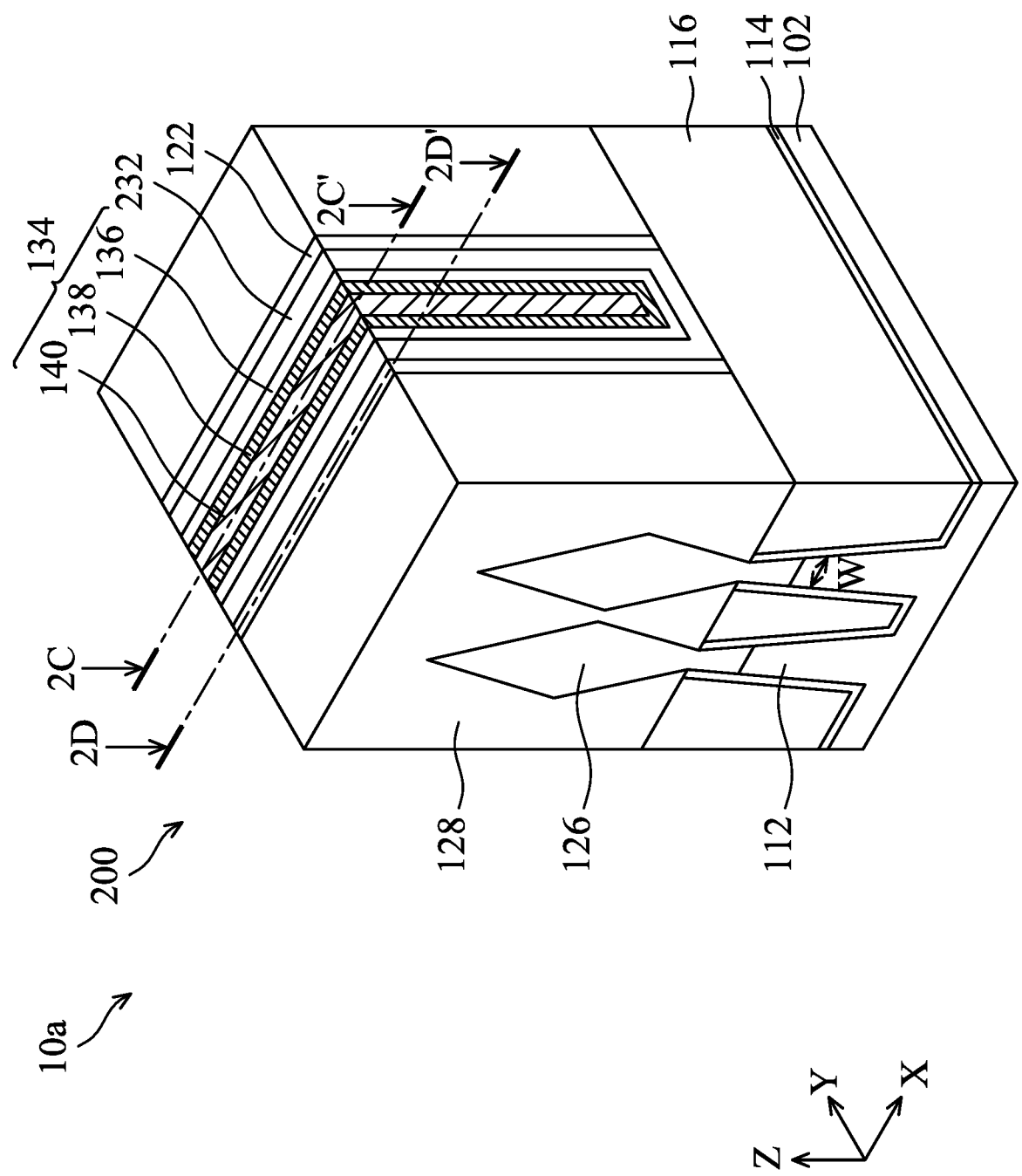

Next, a gate structure 134 is formed over the first oxide layer 132 and the second oxide layer 232 across the fin structure 112 in the core region 100 and the I/O region 200, as shown in FIGS. 1L-1 and 1L-2 in accordance with some embodiments. In some embodiments, the gate structure 134 includes a gate dielectric layer 136, a work function layer 138, and a gate electrode layer 140. In some embodiments, the gate dielectric layer 136 may include a high-k dielectric layer (e.g., the dielectric constant is greater than 3.9) such as hafnium oxide ($HfO_2$). The high-k dielectric layer may include other high-k dielectrics such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $BaTiO_3$, $SrTiO_3$, $Al_2O_3$, other applicable high-k dielectric materials, or a combination thereof. In some embodiments, the gate dielectric layer 136 may be formed by a chemical vapor deposition process (CVD) (e.g., a plasma enhanced chemical vapor deposition (PECVD) process, a metalorganic chemical vapor deposition (MOCVD) process, or a high density plasma chemical vapor deposition (HDPCVD)), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

In some embodiments, the work function layer 138 is formed over the gate dielectric layer 136. The work function metal layer 138 provides the desired work function for transistors to enhance device performance including improved threshold voltage. The work function metal layer 138 may be made of metal materials, and the metal materials may include N-work-function metal or P-work-function metal. For N-type transistors, N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. For P-type transistors, the P-work-function metal may include titanium nitride (TiN), tungsten nitride (WN), tantalum nitride (TaN), ruthenium (Ru) or a combination thereof.

In some embodiments, the gate electrode layer 140 is formed over the work function layer 138. In some embodiments, the metal gate electrode layer 140 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. In some embodiments, the gate electrode layer 140 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

In some embodiments, the material and the process for forming the gate dielectric layer 136, the work function layer 138, and the gate electrode layer 140 in the core region 100 and the I/O region 200 are the same. In some embodiments, the material and the process for forming the gate dielectric layer 136, the work function layer 138, and the gate electrode layer 140 in the core region 100 and the I/O region 200 are different, depending on the demands on the device's performance.

FIGS. 2C-1 and 2C-2 show cross-sectional representations of the FinFET device structure 10a shown in FIGS. 1L-1 and 1L-2 respectively. FIGS. 2C-1 and 2C-2 show cross-sectional representations taken along line 2C-2C' in the FinFET channel region in FIGS. 1L-1 and 1L-2. FIGS. 2C-1 and 2C-2 are cross-sections of the fin structure 112 in the channel region of the FinFET device structure 10a. Since the fin structures 112 in the core region 100 and the I/O region 200 are trimmed as shown in FIGS. 1J-1 and 1J-2 in accordance with some embodiments, the gate structure 134 including the gate dielectric layer 136, the work function layer 138, and the gate electrode layer 140 may be filled into the space between adjacent fin structures 112 in both the core region 100 and the I/O region 200 with the desired thickness. Therefore, the desired threshold voltage of the FinFET device structure 10a in both the core region 100 and the I/O region 200 may be achieved by fine-tuning the thickness of the work function layer 138 and may be not limited by the space between adjacent fin structures 112.

In addition, as shown in FIGS. 2C-1 and 2C-2 in accordance with some embodiments, the height HH of the fin top layer 106 is in a range from about 1 nm to 10 nm. The height HH of the fin top layer 106 may affect the thickness of the gate structure 134, and may further affect the device performance of the FinFET device structure 10a. Therefore, the height HH may also provide a degree of freedom to fine-tune the device parameters.

Figures 1, 2, 2D:
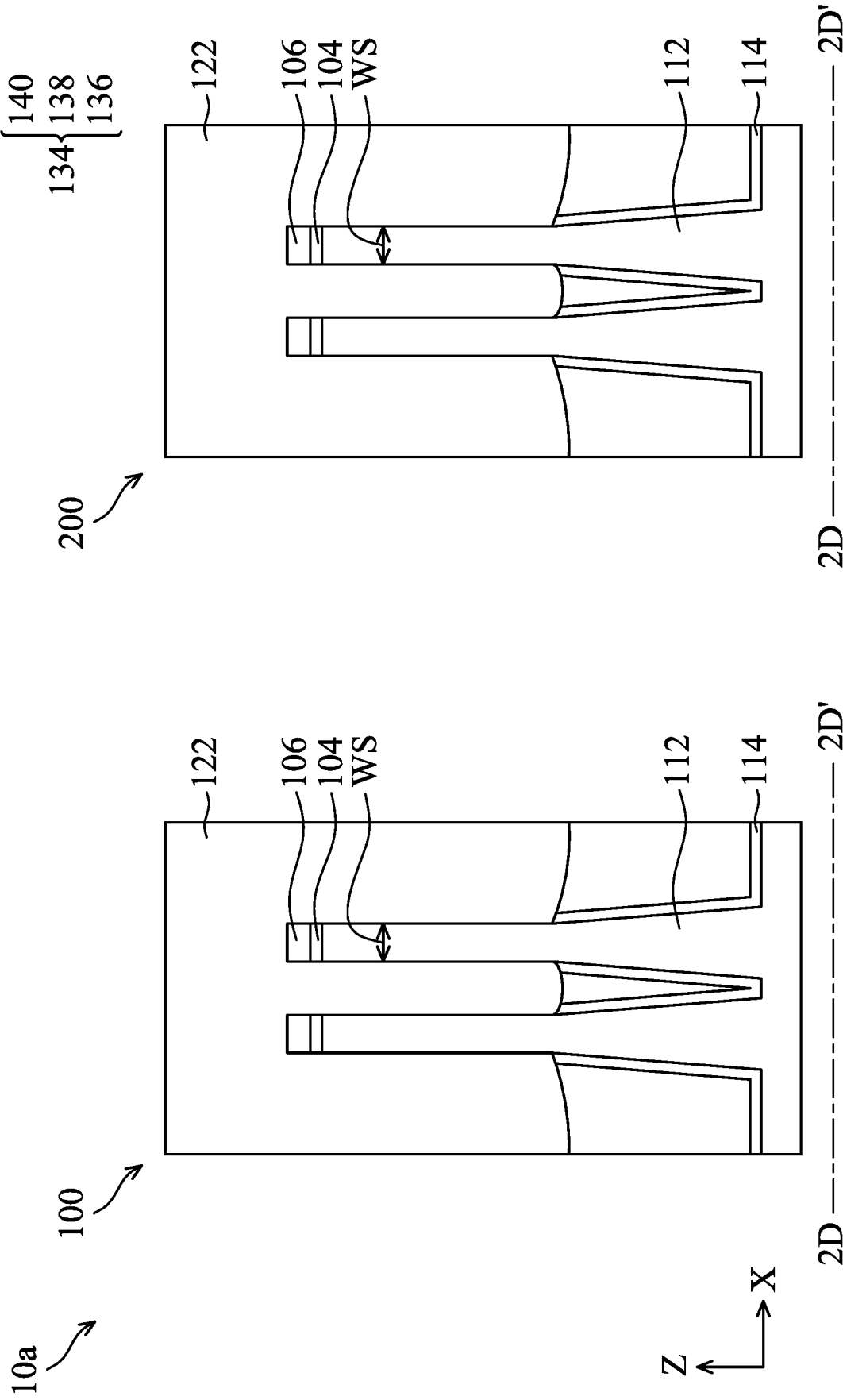

FIGS. 2D-1 and 2D-2 show cross-sectional representations of the FinFET device structure 10a shown in FIGS. 1L-1 and 1L-2 respectively. FIGS. 2D-1 and 2D-2 show cross-sectional representations taken along line 2D-2D' in FIGS. 1L-1 and 1L-2. FIGS. 2D-1 and 2D-2 are cross-sections of the fin structure 112 directly below the spacers 122 of the FinFET device structure 10a. As shown in FIGS. 2D-1 and 2D-2 in accordance with some embodiments, the fin top layer 106 and the pad layer 104 are formed over the top surface of the fin structure 112 directly below the spacer 122. Since the fin structure 112 is trimmed in the channel region but not below the spacers 122 of the FinFET device structure 10a as shown in FIGS. 1J-1 and 1J-2 in accordance with some embodiments, the width WS of the fin structure 112 directly below the spacers 122 is wider than the width WF of the fin structure 112 in the channel region. With thinner fin structure 112 in the channel region, the process window of forming the gate structure 134 over the fin structures 112 in both the core region 100 and the I/O region 200 may be improved.

With a fin top layer 106 over the fin structure 112, it may prevent the top of the fin structure 112 from damage while removing the dummy gate structure 120. The fin structures 112 in both the core region 100 and I/O region 200 may be trimmed after the dummy gate structure 120 is removed, therefore, the space between adjacent fin structures 112 in both the core region 100 and I/O region 200 may be enlarged, and the process window of forming the gate structure 134 over the fin structures 112 in both the core region 100 and the I/O region 200 may be improved.

Figures 1, 3A:
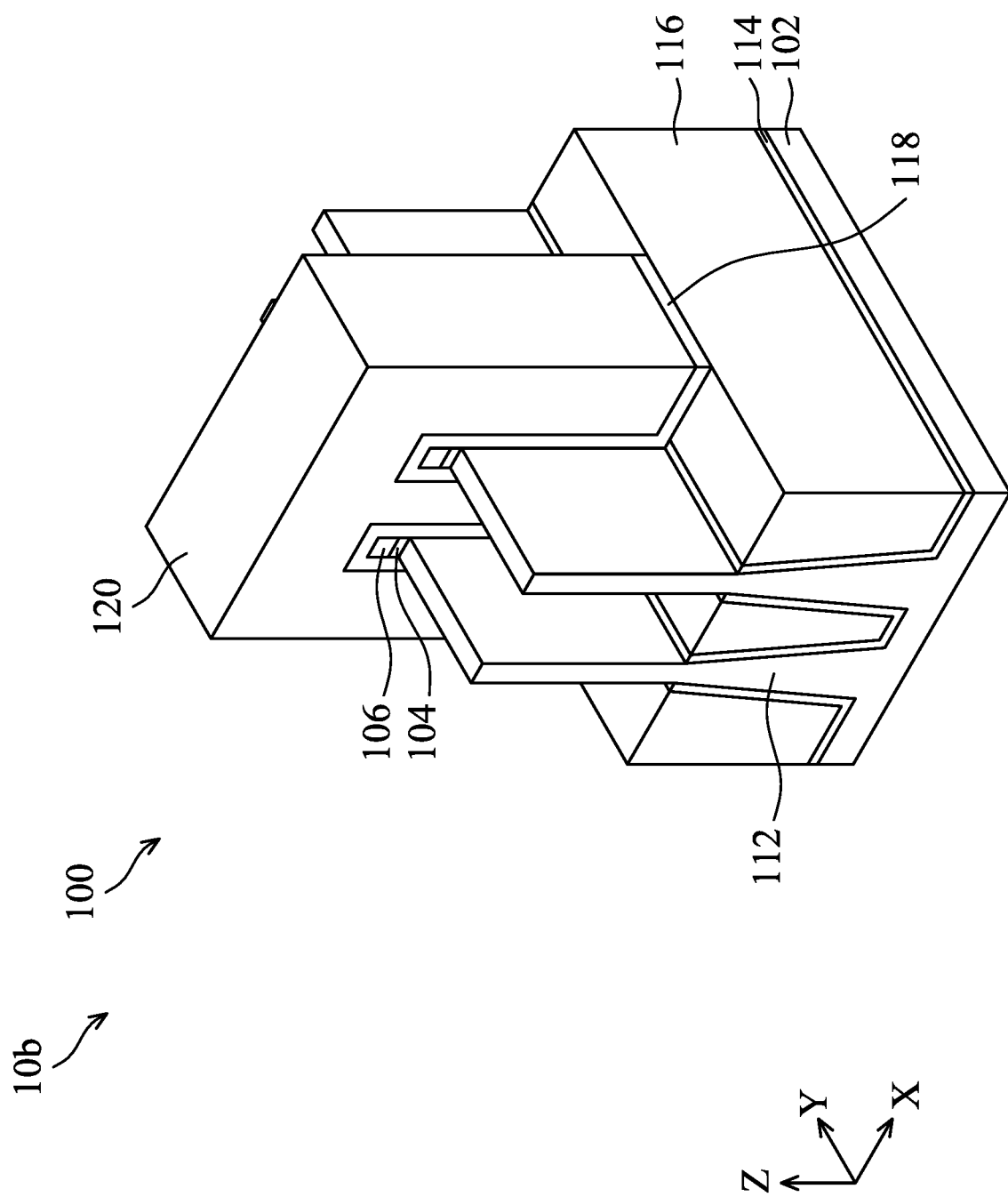
Figures 2, 3A:
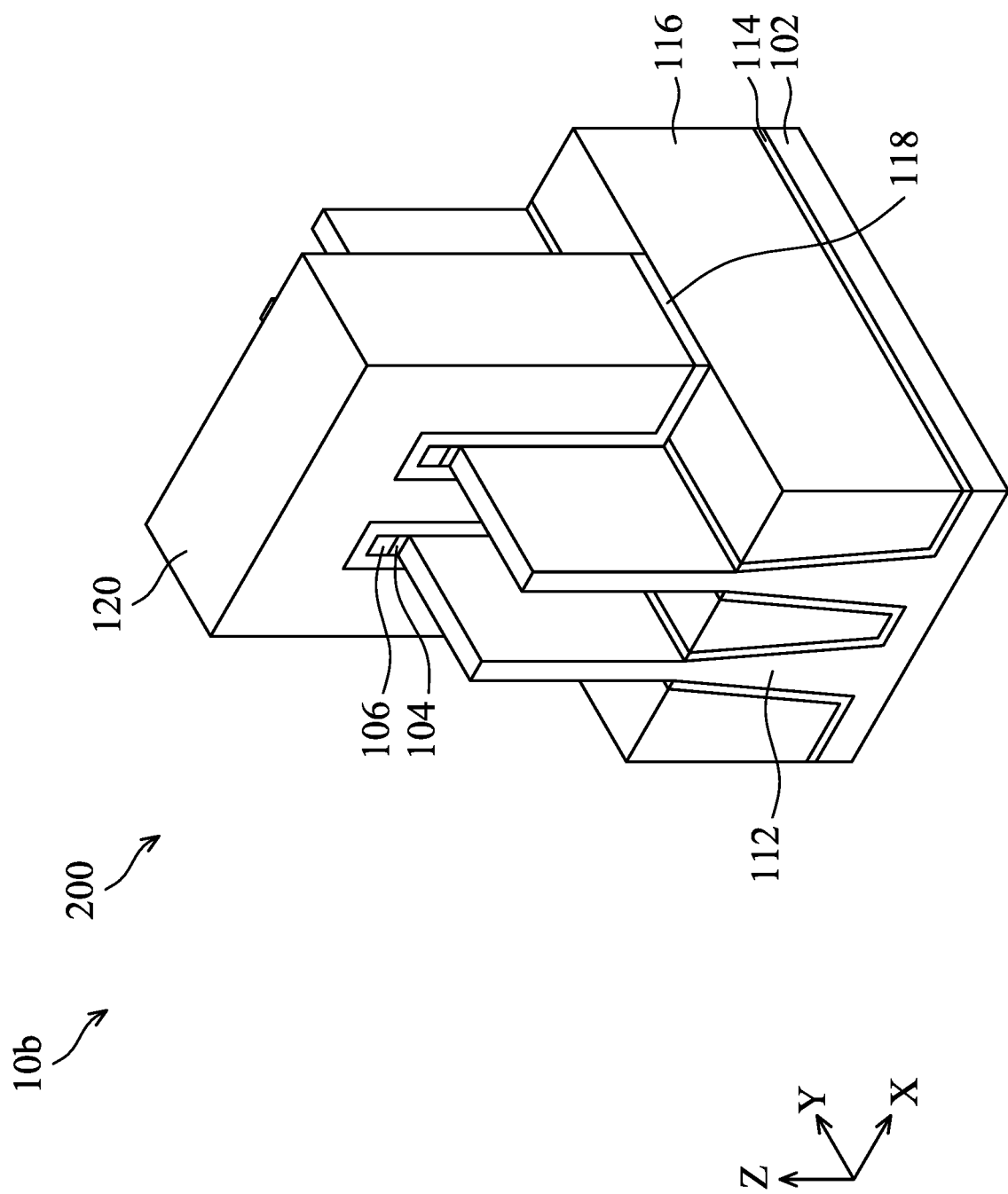
Figures 1, 3B:
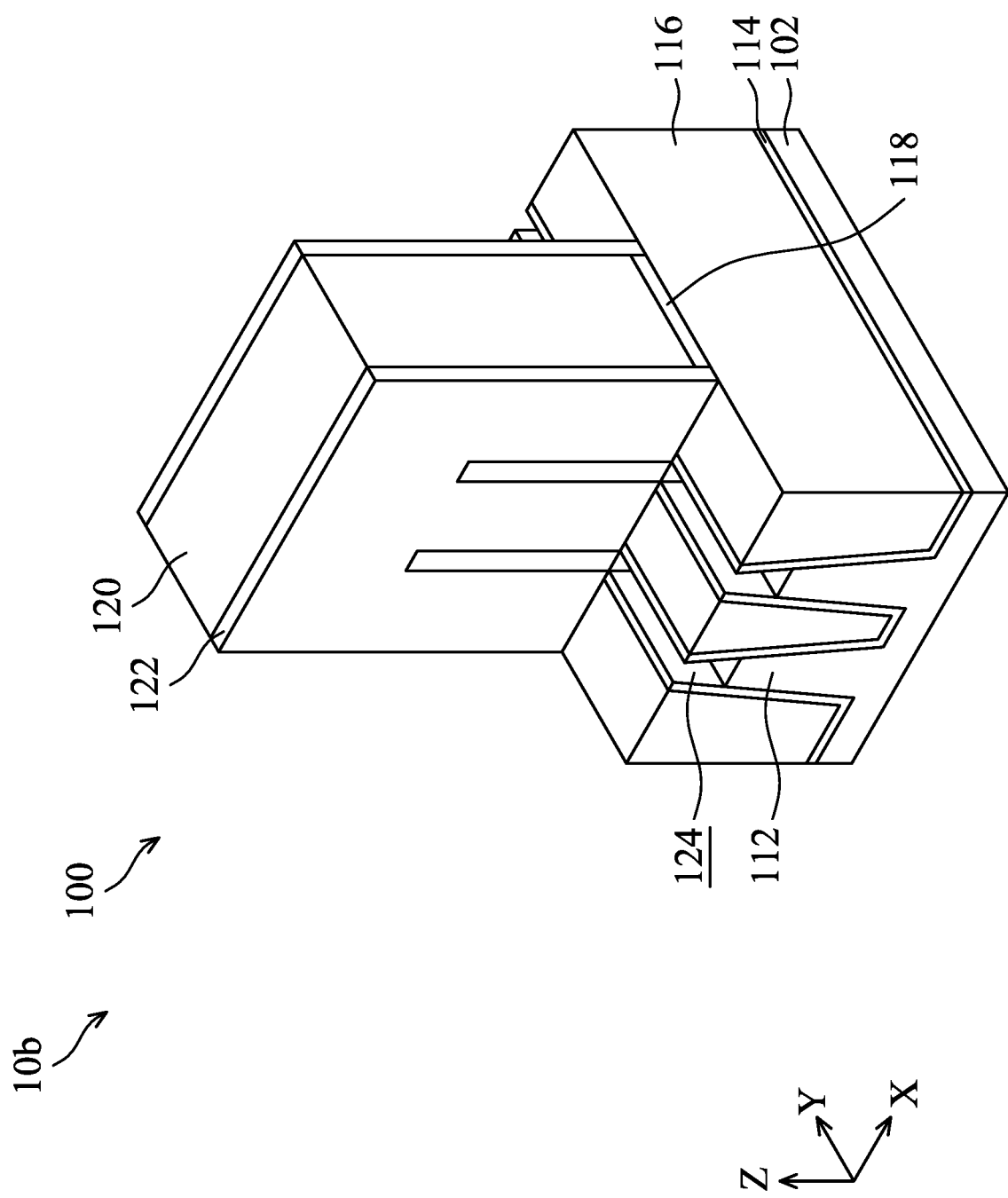
Figures 2, 3B:
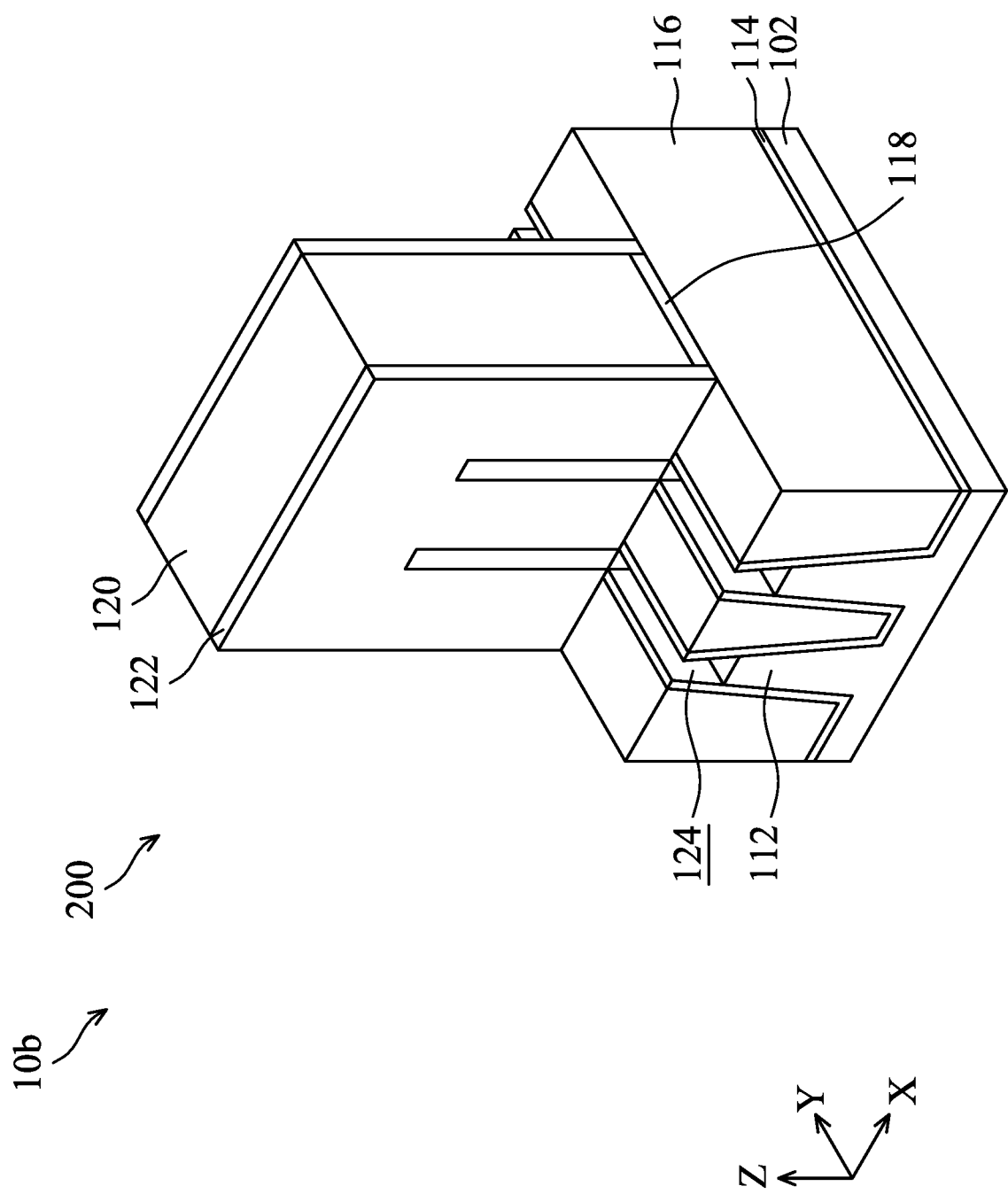

Many variations and/or modifications may be made to the embodiments of the disclosure. FIGS. 3A-1, 3A-2, 3B-1, 3B-2, 3C-1, 3C-2 are perspective representations of various stages of forming a modified FinFET device structure 10b, in accordance with some other embodiments of the disclosure. In some embodiments, the substrate 102 of the FinFET device structure 10b includes a core region 100 and an I/O region 200. Some processes or devices are the same as, or similar to, those described in the embodiments above, and therefore the reference numerals and/or letters may be repeated. For the purpose of brevity, the descriptions of these processes and devices are not repeated herein. The difference from the embodiments described above is that, as shown in FIGS. 3A-1 and 3A-2 in accordance with some embodiments, the fin top layer 106 and the pad layer 104 are removed when the dummy gate structure 120 is formed by a patterned photoresist layer as a mask (not shown). Therefore, after forming the spacers 122, as shown in FIGS. 3B-1 and 3B-2 in accordance with some embodiments, only the top portion of the fin structure 112 is exposed from the spacers 122.

Figures 1, 3C:
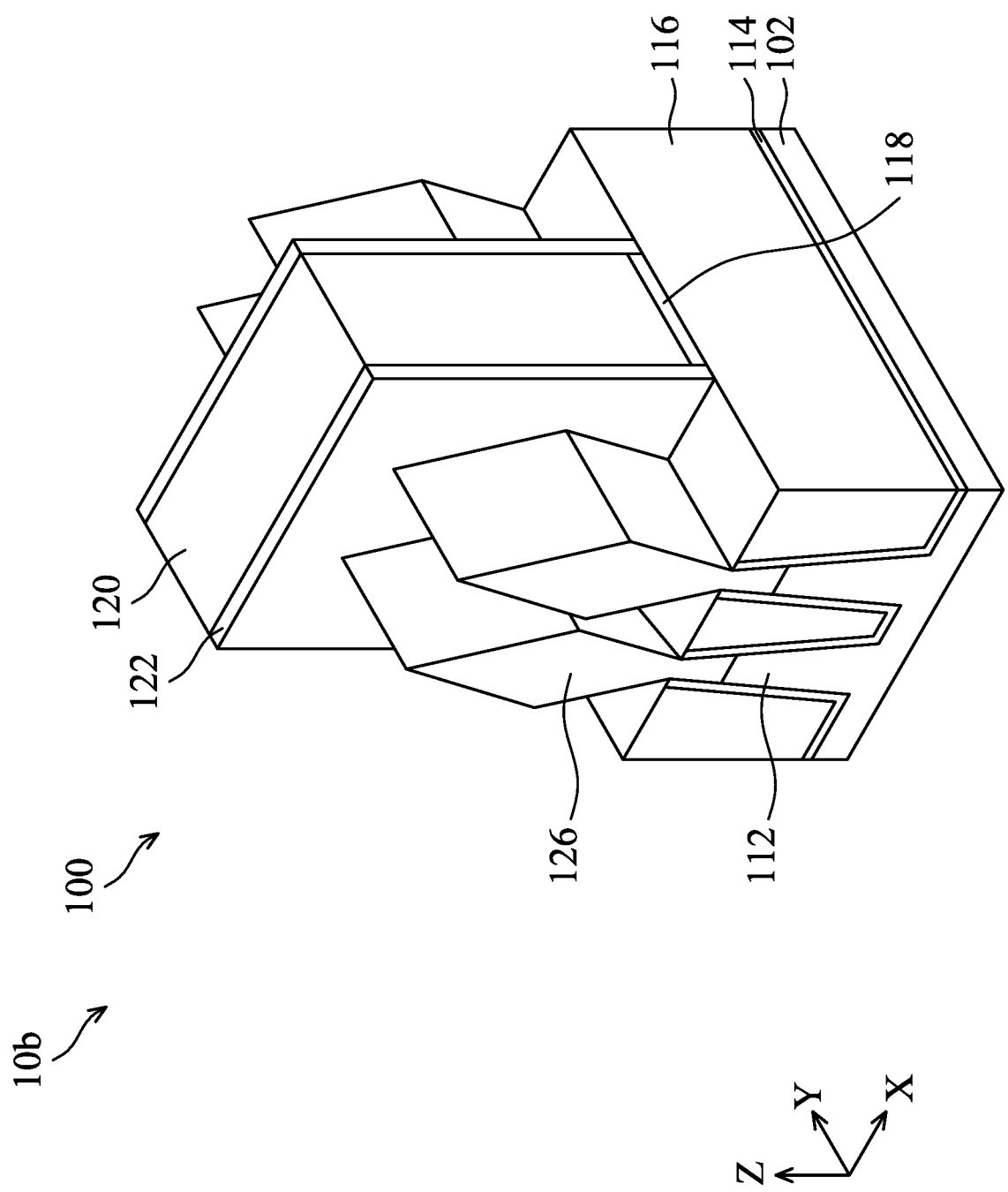
Figures 2, 3C:
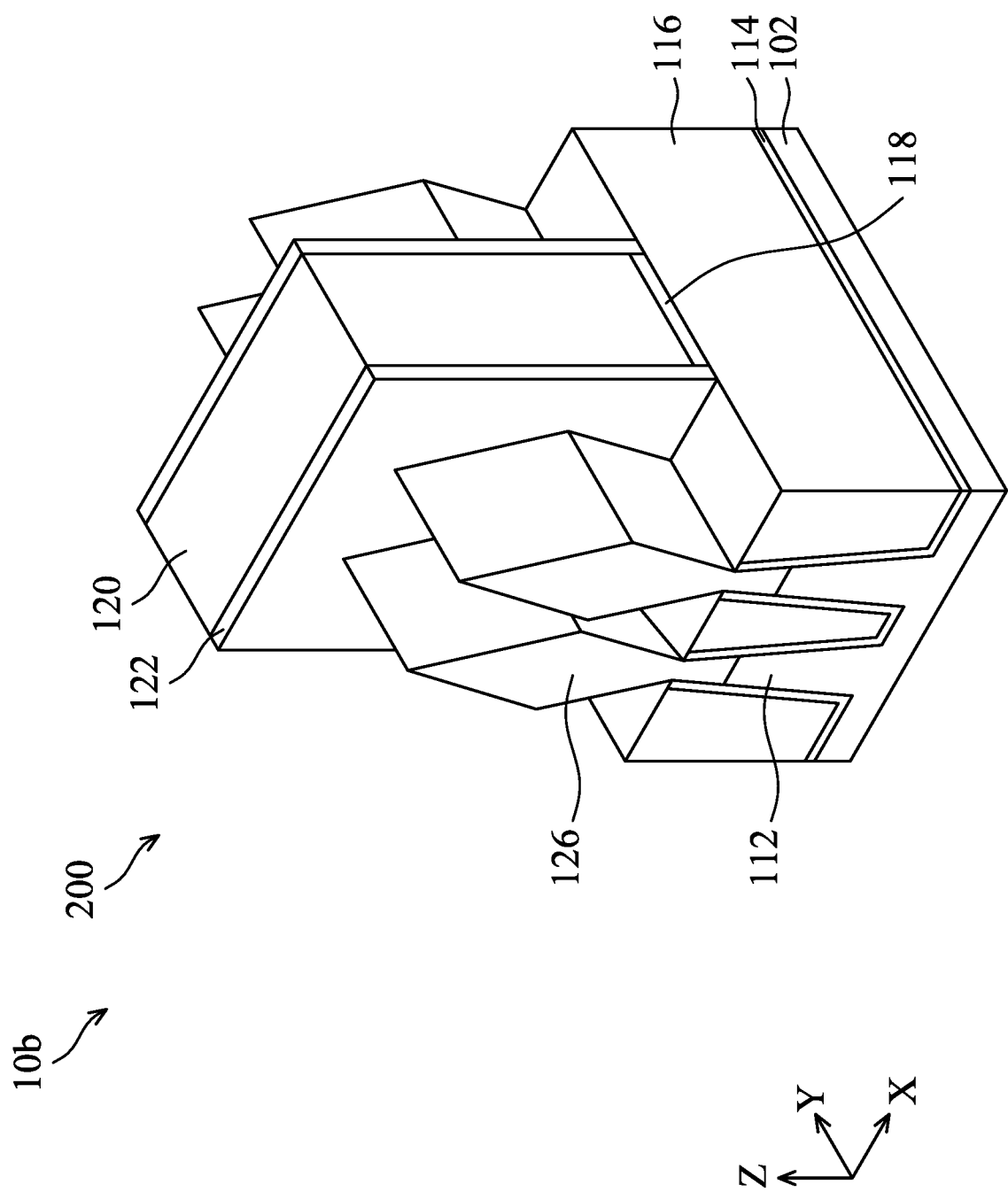

Next, as shown in FIGS. 3C-1 and 3C-2 in accordance with some embodiments, S/D structure 126 is formed over the fin structure 112. In some embodiments, since only the top portion of the fin structure 112 is exposed from the spacers 122, the subsequently grown source/drain (S/D) structure 126 may not directly contact the fin top layer 106 and the pad layer 104, and the quality of the grown source/drain (S/D) structure 126 may be better and therefore the device performance may be enhanced.

While the fin top layer 106 and the pad layer 104 may be removed during forming the dummy gate structure 120, which is after forming the dummy oxide layer 118 and before forming the spacers 122, the fin top layer 106 and the pad layer 104 may not be exposed from the spacers 122. Therefore, it may help to improve the quality of S/D structure 126 grown in the following process.

FIGS. 4A-1, 4A-2, 4B-1, 4B-2, 4C-1, 4C-2 are perspective representations of various stages of forming a modified FinFET device structure 10c, in accordance with some other embodiments of the disclosure. FIGS. 5A-1, 5A-2 are cross-sectional representations of various stages of forming a FinFET device structure shown in FIGS. 4C-1, 4C-2, in accordance with some embodiments of the disclosure.

In some embodiments, the substrate 102 of the FinFET device structure 10c includes a core region 100 and an I/O region 200. Some processes or devices are the same as, or similar to, those described in the embodiments above, and therefore the reference numerals and/or letters may be repeated. For the purpose of brevity, the descriptions of these processes and devices are not repeated herein. The difference from the embodiments described above is that, as shown in FIGS. 4A-1, 4A-2 in accordance with some embodiments, after protecting the fin structure 112 while removing the dummy gate structure 120, the top layer 106 and the pad layer 104 are removed after removing the dummy gate structure 120. Therefore, only the top portion of the fin structure 112 may be exposed from the trench 130.

Figures 1, 4A:
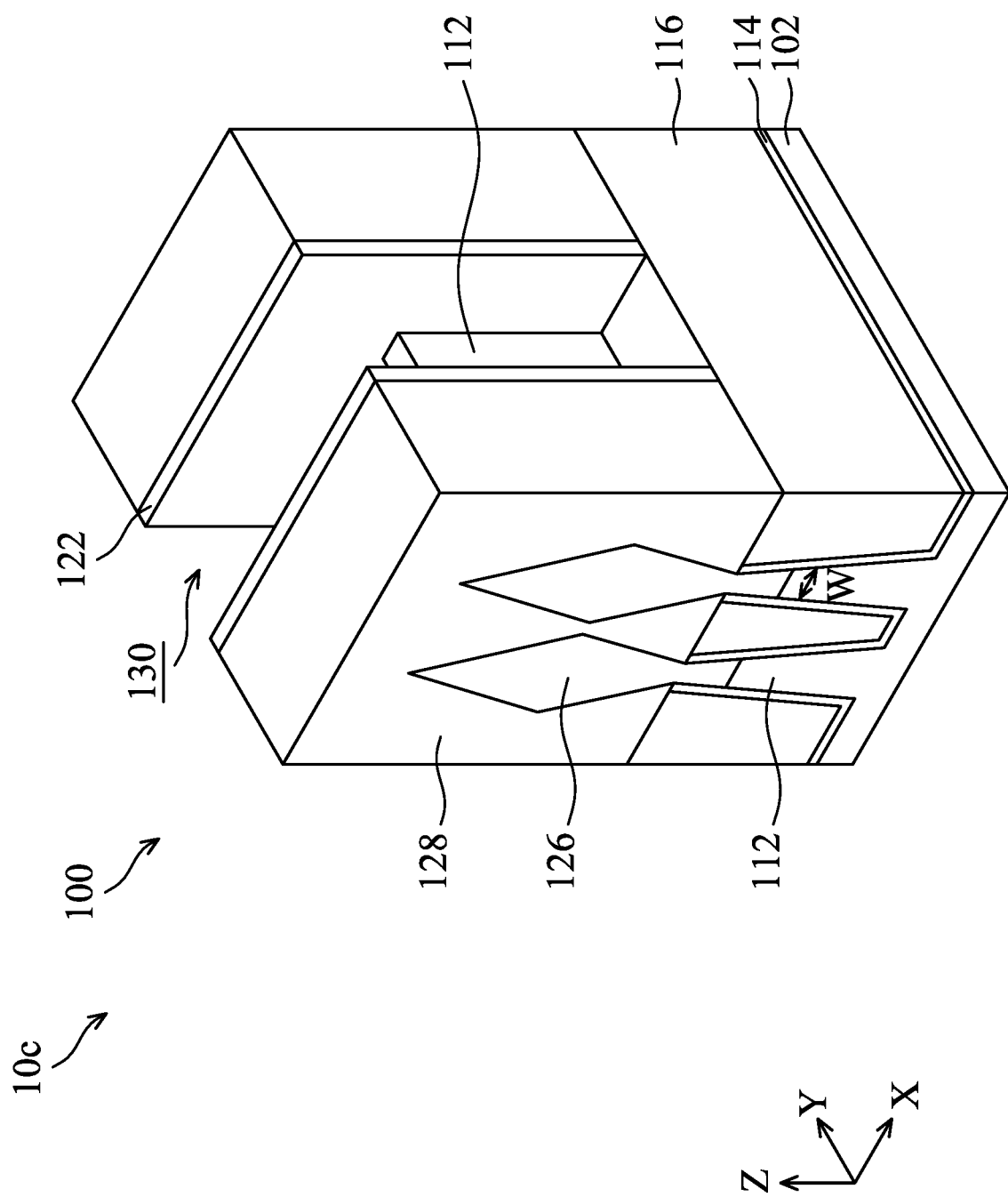
Figures 2, 4A:
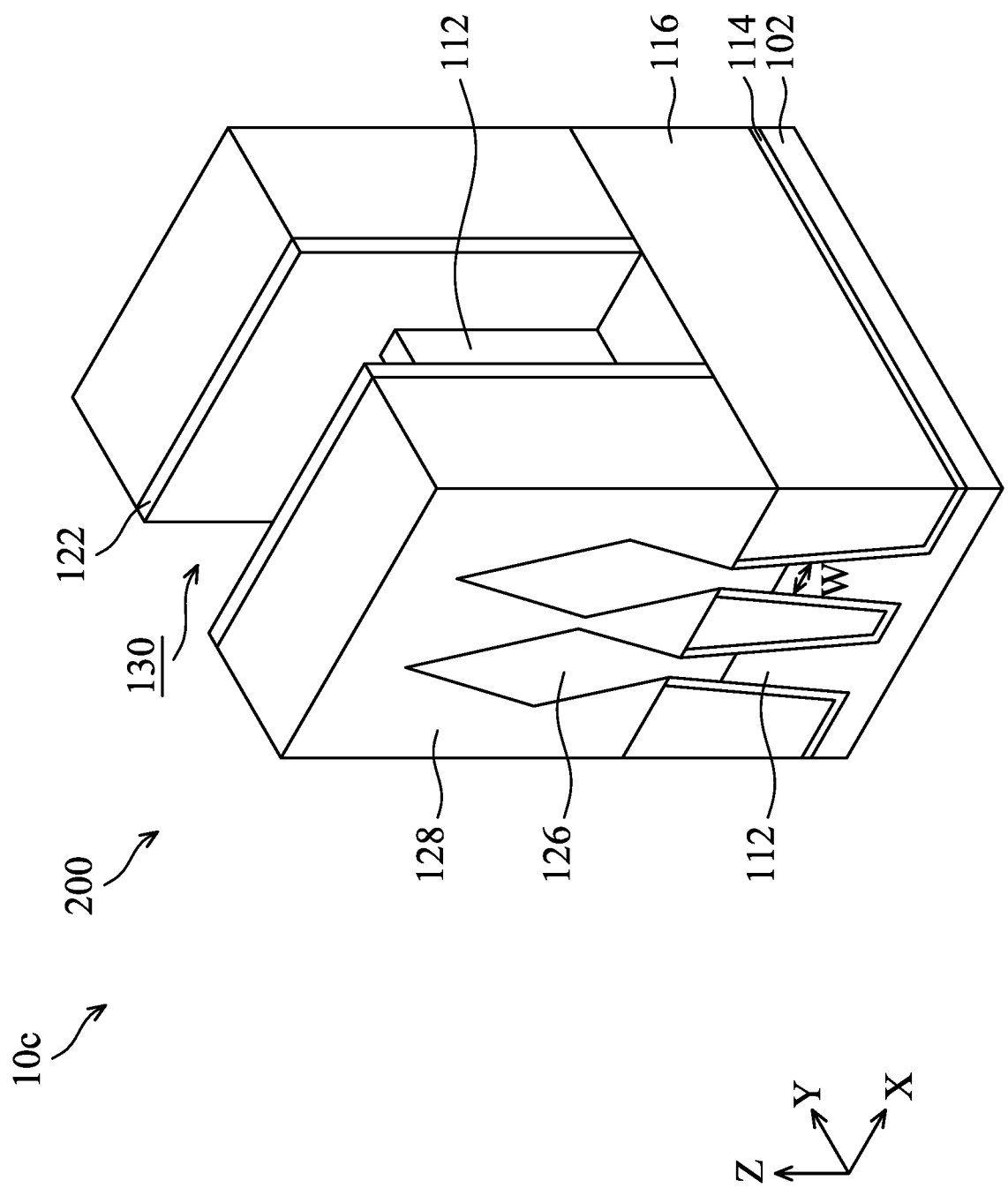
Figures 1, 4B:
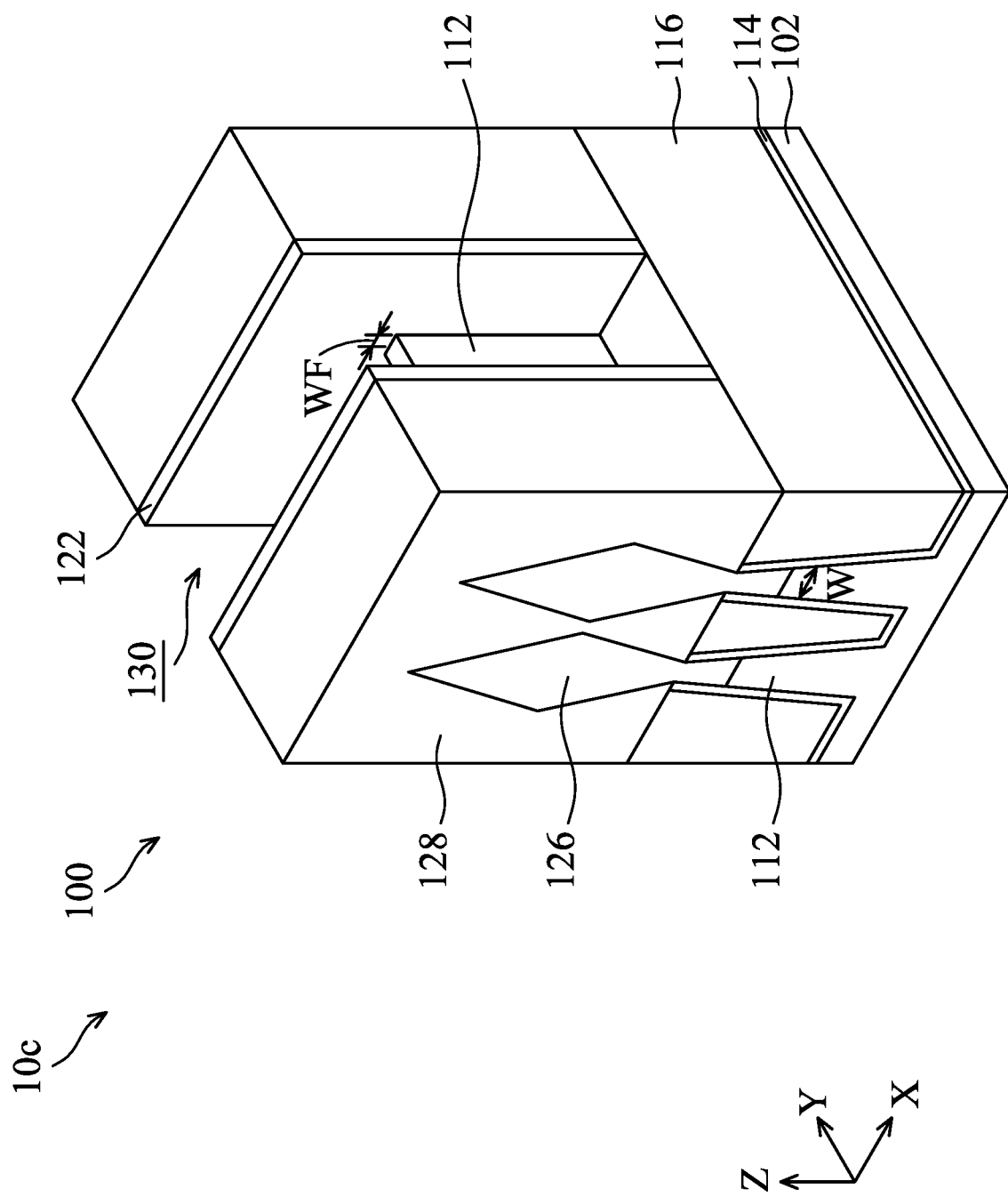
Figures 2, 4B:
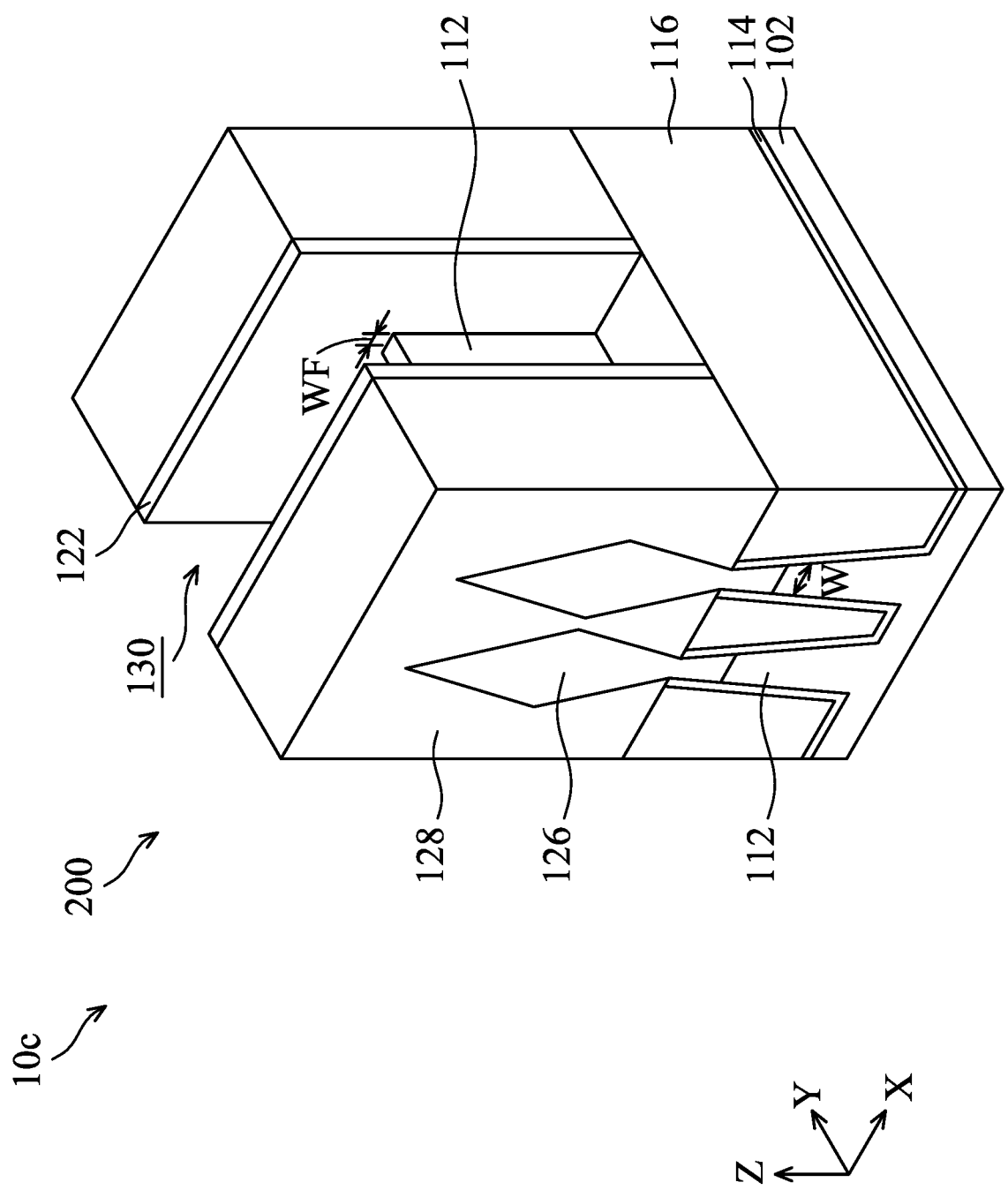
Figures 1, 2, 5A:
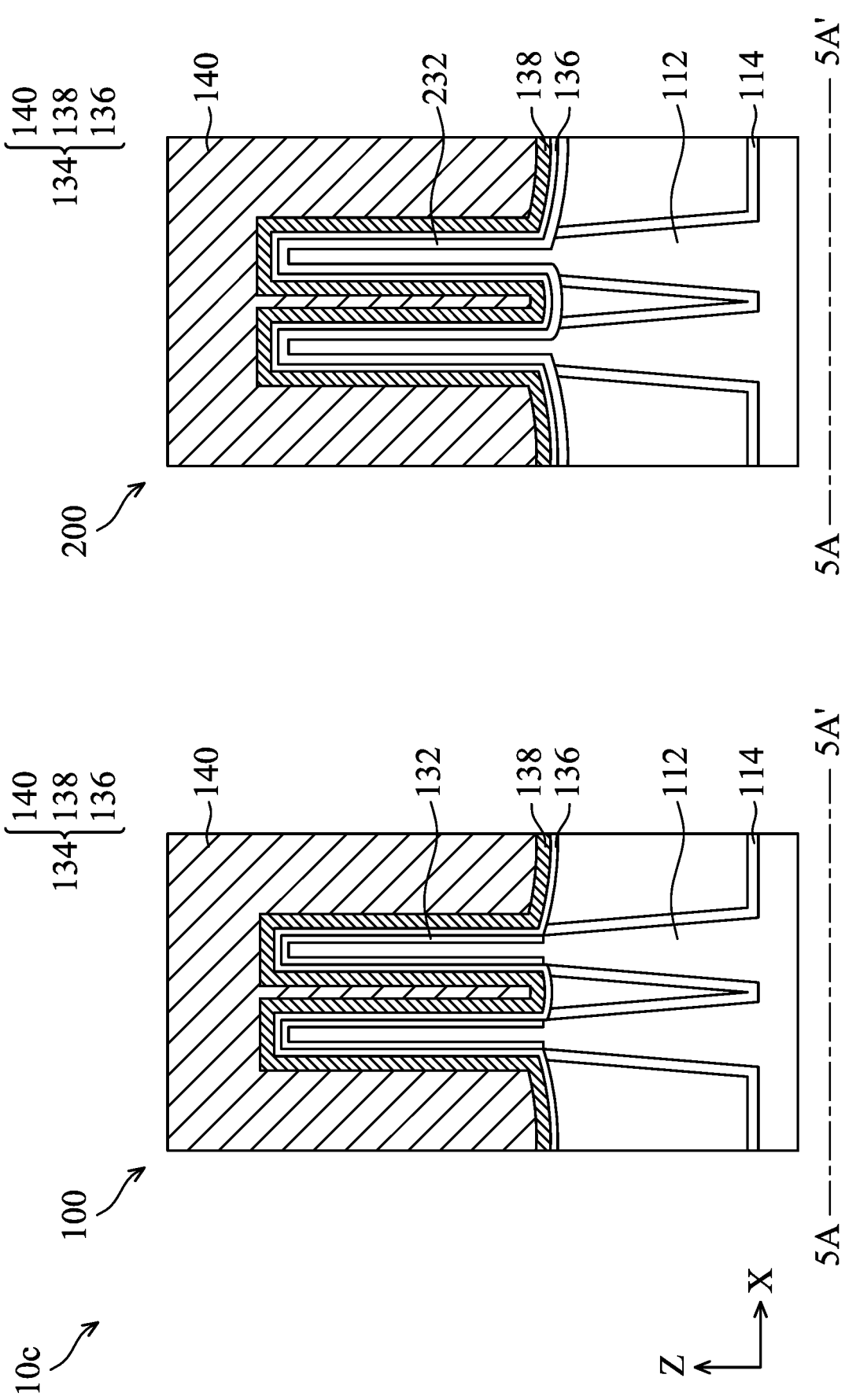

Next, only the fin structure 112 in the trench 130 is trimmed in both the core region 100 and the I/O region 200, as shown in FIGS. 4B-1 and 4B-2 in accordance with some embodiments. In some embodiments, the width WF of the fin structure 112 in the trench 130 is narrower than the width W of the fin structure 112 under in the S/D region.

Figures 1, 4C:
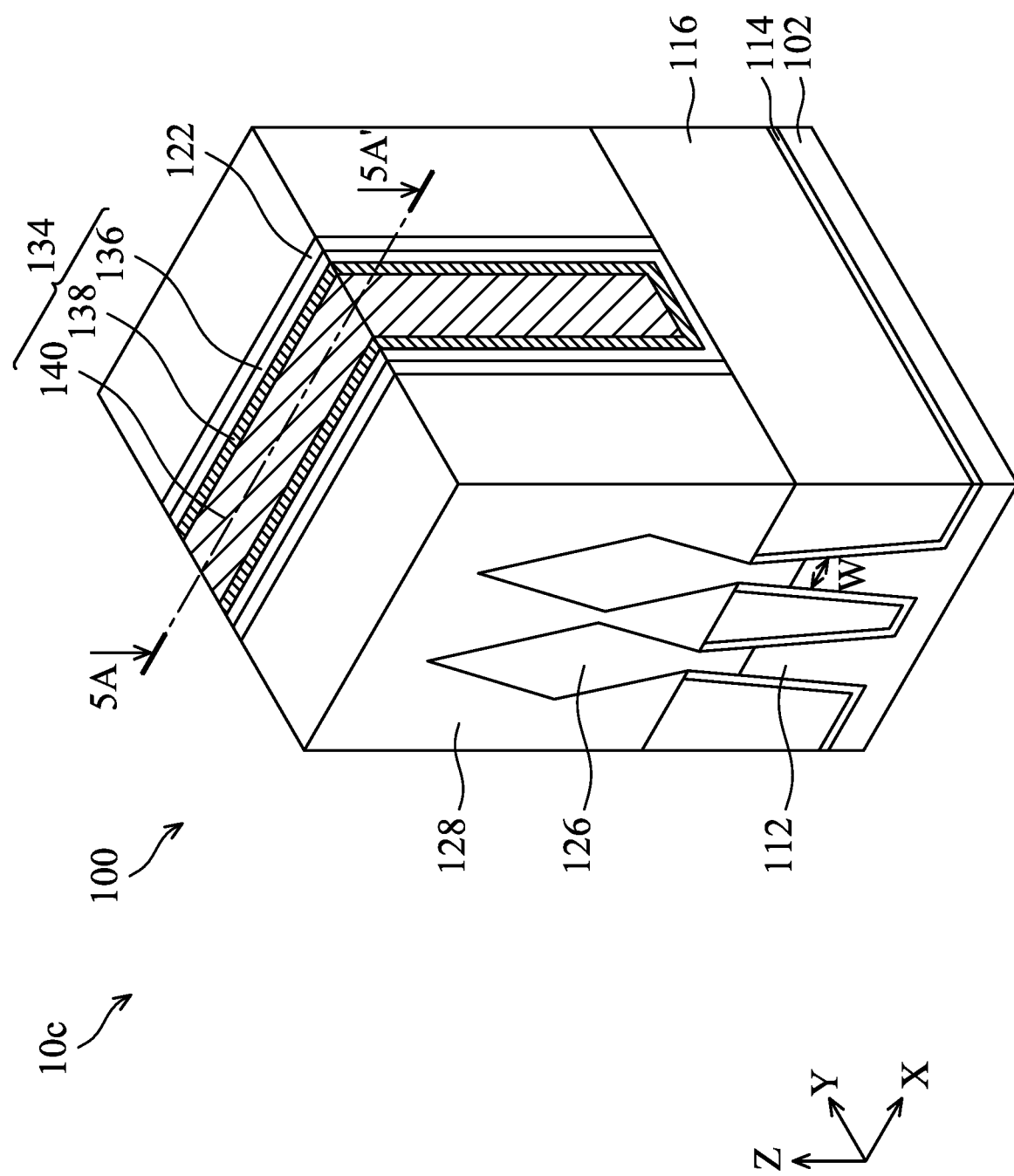
Figures 2, 4C:
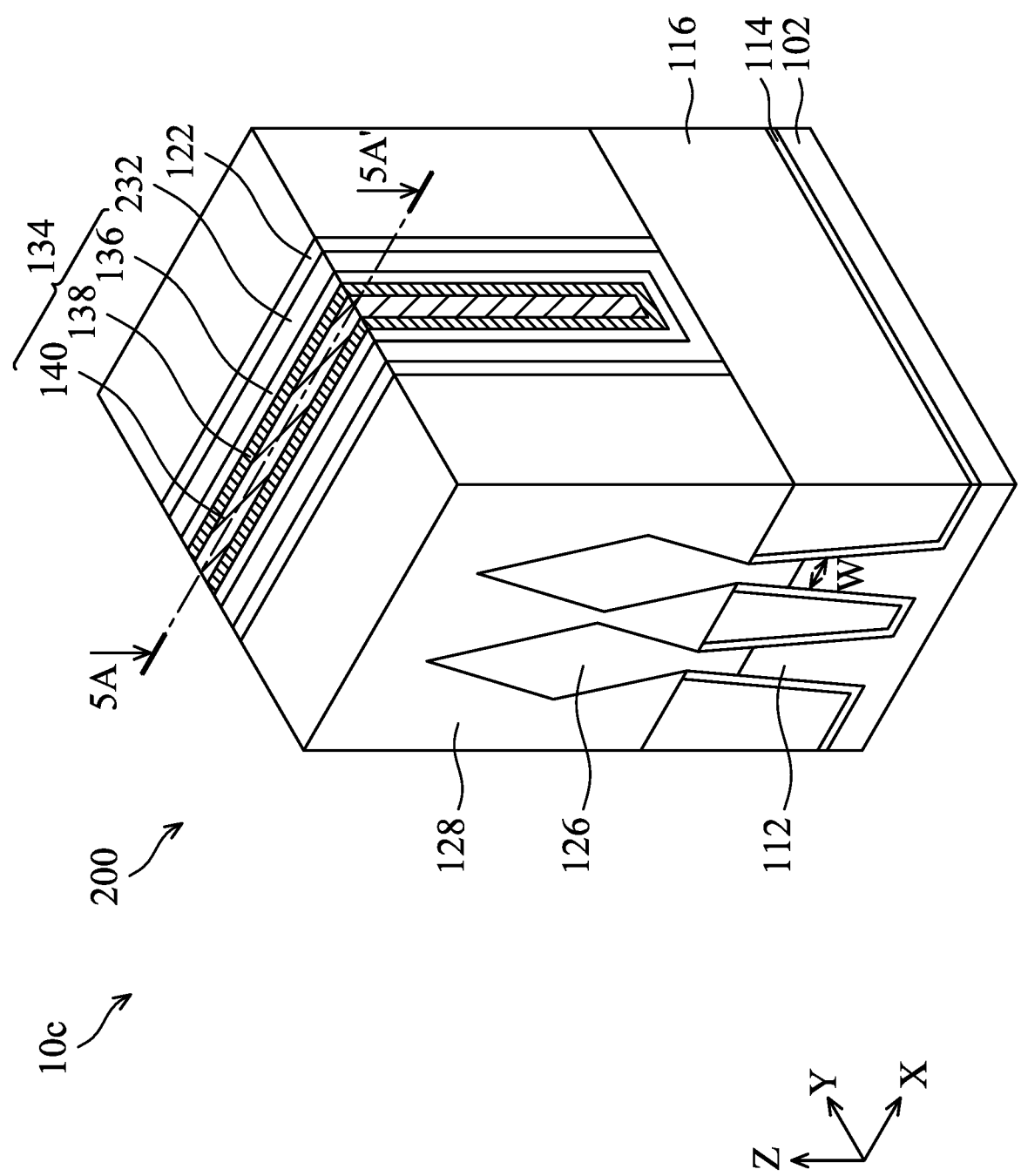

Afterwards, a first oxide layer 132 may be formed across the fin structure 112 in the core region 100, and a second oxide layer 232 may be formed over the fin structure 112 in the I/O region 200 (not shown). Then a gate structure 134 is formed over the first oxide layer 132 and the second oxide layer 232 across the fin structures 112 in the core region 100 and the I/O region 200, as shown in FIGS. 4C-1 and 4C-2 in accordance with some embodiments. In some embodiments, the gate structure 134 includes a gate dielectric layer 136, a work function layer 138, and a gate electrode layer 140.

FIGS. 5A-1 and 5A-2 show cross-sectional representations of the FinFET device structure 10c shown in FIGS. 4C-1 and 4C-2 respectively. FIGS. 5A-1 and 5A-2 show cross-sectional representations taken along line 5A-5A' in FIGS. 4C-1 and 4C-2. FIGS. 5A-1 and 5A-2 are cross-sections of the fin structure 112 in the channel region of the FinFET device structure 10c. Since the fin top layer 106 and the pad layer 104 may be removed after removing the dummy gate structure 120 and before trimming the fin structure 112, there may be no fin top layer 106 or pad layer 104 over the fin structure 112 and under the gate structure 134. Since the fin top layer 106 may be made of dielectric materials, it may impact the Alternating Current (AC) performance of the FinFET device structure 10c. Without the fin top layer 106 over the fin structure 112, the device performance may not be affected.

After protecting the fin structure 112 while removing the dummy gate structure 120, the fin top layer 106 and the pad layer 104 may be removed before trimming the fin structure 112. Therefore, the fin top layer 106 may not affect the device performance of the FinFET device structure 10c and the fin structure 112 is protected.

As described previously, in both the core region 100 and I/O region 200, the fin top layer 106 may protect the fin structure 112 while removing the dummy gate structure 120. The fin structure 112 in both the core region 100 and I/O region 200 may be trimmed to improve the gap filling process window of the gate structure 134. Moreover, the reliability may be improved with thicker gate oxide layer 132/232. In some embodiments as shown in FIGS. 2C-1 and 2C-2, the fin top layer 106 in the FinFET channel region may provide a degree of freedom to fine-tune device parameters. In some embodiments as shown in FIGS. 3A-1, 3A-2, 3B-1, 3B-2, 3C-1, 3C-2, the grown quality of the S/D structure 126 may be improved by removing the fin top layer 106 directly under the spacers 122. In some embodiments as shown in FIGS. 4A-1, 4A-2, 4B-1, 4B-2, 4C-1, 4C-2, removing the fin top layer 106 in the FinFET channel region may also maintain the device performance.

Embodiments of a FinFET device structure and method for forming the same are provided. The method for forming the FinFET device structure includes forming a fin top layer over the fin structure in the core region and the I/O region. The fin structures in the core region and the I/O region are trimmed after removing the dummy gate structure. The gate structure is then filled into the space between the trimmed fin structures. The fin top layer may protect the fin structure while removing the dummy gate structure. The gate structure gap filling window may be improved with trimmed fin structures in both the core region and the I/O region.

In some embodiments, a method for forming a FinFET device structure is provided. The method for forming a FinFET device structure includes forming a first fin structure in a core region of a substrate and a second fin structure in an input/output (I/O) region of the substrate with a fin top layer and a hard mask layer over the first fin structure and the second fin structure. The method for forming a FinFET device structure also includes forming a dummy oxide layer across the first fin structure and the second fin structure. The method for forming a FinFET device structure also includes forming a dummy gate structure over the dummy oxide layer across the first fin structure and the second fin structure. The method for forming a FinFET device structure also includes forming spacers on opposite sides of the dummy gate structure. The method for forming a FinFET device structure also includes removing the dummy gate structure over the first fin structure and the second fin structure. The method for forming a FinFET device structure also includes removing the dummy oxide layer and trimming the first fin structure and the second fin structure. The method for forming a FinFET device structure also includes forming a first oxide layer across the first fin structure and a second oxide layer across the second fin structure. The method for forming a FinFET device structure also includes forming a first gate structure over the first oxide layer across the first fin structure and a second gate structure over the second oxide layer across the second fin structure.

In some embodiments, a method for forming a FinFET device structure is provided. The method for forming a FinFET device structure includes forming a fin structure in an input/output (I/O) region of a substrate with a fin top layer over the fin structure and a hard mask layer over the fin top layer. The method for forming a FinFET device structure also includes removing the hard mask layer and forming an isolation structure surrounding a base portion of the fin structure. The method for forming a FinFET device structure also includes forming a dummy oxide layer across the fin structure. The method for forming a FinFET device structure also includes forming a dummy gate structure over the dummy oxide layer across the fin structure. The method for forming a FinFET device structure also includes forming spacers on opposite sides of the dummy gate structure. The method for forming a FinFET device structure also includes removing the dummy gate structure to form a trench. The method for forming a FinFET device structure also includes removing the dummy oxide layer. The method for forming a FinFET device structure also includes reducing the width of the fin structure through the trench. The method for forming a FinFET device structure also includes forming an oxide layer in the trench. The method for forming a FinFET device structure also includes forming a gate structure over the oxide layer in the trench.

In some embodiments, a FinFET device structure is provided. The FinFET device structure includes a first fin structure formed in an input/output (I/O) region of a substrate. The first fin structure includes a base portion of the first fin structure surrounded by an isolation structure. The first fin structure also includes a joint portion of the first fin structure connecting a top portion of the first fin structure and the base portion of the first fin structure. The FinFET device structure also includes a first oxide layer formed across the first fin structure. The FinFET device structure also includes a first gate structure formed over the first oxide layer across the first fin structure. The FinFET device structure also includes spacers formed on opposite sides of the first gate structure. The slope of the joint portion of the first fin structure is less than the slope of the top portion of the first fin structure and the slope of the base portion of the first fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
 forming a first fin structure in a core region of a substrate and a second fin structure in an input/output (I/O) region of the substrate with a fin top layer and a hard mask layer over the first fin structure and the second fin structure;
 forming a dummy oxide layer across the first fin structure and the second fin structure;
 forming a dummy gate structure over the dummy oxide layer across the first fin structure and the second fin structure;
 forming spacers on opposite sides of the dummy gate structure;
 removing the dummy gate structure over the first fin structure and the second fin structure;
 removing the dummy oxide layer and trimming the first fin structure and the second fin structure;
 forming a first oxide layer across the first fin structure and a second oxide layer across the second fin structure; and
 forming a first gate structure over the first oxide layer across the first fin structure and a second gate structure over the second oxide layer across the second fin structure.

2. The method for forming the fin field effect transistor device structure as claimed in claim 1, wherein the second oxide layer is thicker than the first oxide layer.

3. The method for forming the fin field effect transistor device structure as claimed in claim 1, further comprising:
 removing the fin top layer after forming the dummy oxide layer and before forming the spacers.

4. The method for forming the fin field effect transistor device structure as claimed in claim 1, further comprising:
removing the fin top layer after removing the dummy gate structure and before trimming the first fin structure and the second fin structure.

5. The method for forming the fin field effect transistor device structure as claimed in claim 1, wherein after trimming the fin structure, a width of the fin top layer is less than a width of the first fin structure and the second fin structure.

6. The method for forming the fin field effect transistor device structure as claimed in claim 1, wherein the first fin structure and the second fin structure are trimmed by separated etching processes.

7. The method for forming the fin field effect transistor device structure as claimed in claim 1, further comprising:
forming an isolation structure surrounding a base portion of the first fin structure and the second fin structure; and
forming a joint portion of the first fin structure and the second fin structure connecting a top portion of the first fin structure and the second fin structure and the base portion of the first fin structure and the second fin structure after trimming the first fin structure and the second fin structure,
wherein a surface of the joint portion of the first fin structure and the second fin structure is aligned with a top surface of the isolation structure.

8. A method for forming a fin field effect transistor device structure, comprising:
forming a fin structure in an input/output (I/O) region of a substrate with a fin top layer over the fin structure and a hard mask layer over the fin top layer;
removing the hard mask layer and forming an isolation structure surrounding a base portion of the fin structure;
forming a dummy oxide layer across the fin structure;
forming a dummy gate structure over the dummy oxide layer across the fin structure;
forming spacers on opposite sides of the dummy gate structure;
removing the dummy gate structure to form a trench;
removing the dummy oxide layer;
reducing a width of the fin structure through the trench;
forming an oxide layer in the trench; and
forming a gate structure over the oxide layer in the trench.

9. The method for forming the fin field effect transistor device structure as claimed in claim 8, wherein a width of the fin structure at a FinFET source/drain region is wider than a width of the fin structure at a FinFET channel region.

10. The method for forming the fin field effect transistor device structure as claimed in claim 8, wherein a width of the fin structure directly below the spacers is wider than a width of the fin structure at a FinFET channel region.

11. A fin field effect transistor device structure, comprising:
a first fin structure formed in an input/output (I/O) region of a substrate, comprising:
a base portion of the first fin structure surrounded by an isolation structure; and
a joint portion of the first fin structure connecting a top portion of the first fin structure and the base portion of the first fin structure;
a first oxide layer formed across the first fin structure;
a first gate structure formed over the first oxide layer across the first fin structure; and
spacers formed on opposite sides of the first gate structure,
wherein a slope of the joint portion of the first fin structure is less than a slope of the top portion of the first fin structure and a slope of the base portion of the first fin structure.

12. The fin field effect transistor device structure as claimed in claim 11, further comprising:
a fin top layer formed over a top surface of the first fin structure in a FinFET channel region,
wherein a width of the fin top layer is equal to or less than a width of the first fin structure.

13. The fin field effect transistor device structure as claimed in claim 12, further comprising:
a pad layer formed between the fin structure and the fin top layer; and
a middle pad layer formed between the fin top layer and the hard mask layer.

14. The fin field effect transistor device structure as claimed in claim 12, wherein a thickness of the fin top layer is less than 10 nm.

15. The fin field effect transistor (FinFET) device structure as claimed in claim 12, wherein the fin top layer is made of SiCN, SiN, SiOC, SiOCN, $HfO_2$, $ZrO_2$, hafnium aluminate, hafnium silicate, or a combination thereof.

16. The fin field effect transistor device structure as claimed in claim 11, further comprising:
a fin top layer formed over a top surface of the first fin structure directly below the spacers.

17. The fin field effect transistor device structure as claimed in claim 11, wherein the top portion of the first fin structure is misaligned with the base portion of the first fin structure by more than 2 nm.

18. The fin field effect transistor device structure as claimed in claim 11, further comprising:
a second fin structure formed in a core region of a substrate;
a second oxide layer formed across the second fin structure; and
a second gate structure formed over the second oxide layer across the second fin structure,
wherein the second oxide layer is thicker than the first oxide layer.

19. The fin field effect transistor device structure as claimed in claim 18, wherein a difference of a width of the first fin structure and a width of the second fin structure is in a range from about −15% to about +15%.

20. The fin field effect transistor device structure as claimed in claim 18, wherein a fin top layer is formed over a top surface of the second fin structure in a FinFET channel region, wherein a width of the fin top layer is equal to or less than a width of the second fin structure.

* * * * *